United States Patent
Yang et al.

(10) Patent No.: US 12,133,357 B2
(45) Date of Patent: Oct. 29, 2024

(54) COLD PLATE ARCHITECTURE FOR LIQUID COOLING OF DEVICES

(71) Applicant: Intel Corporation, Santa Clara, CA (US)

(72) Inventors: Jin Yang, Hillsboro, OR (US); David Shia, Portland, OR (US); Mohanraj Prabhugoud, Hillsboro, OR (US); Olaotan Elenitoba-Johnson, Tigard, OR (US); Craig Jahne, Beaverton, OR (US); Phil Geng, Washougal, WA (US)

(73) Assignee: Intel Corporation, Santa Clara, CA (US)

( * ) Notice: Subject to any disclaimer, the term of this patent is extended or adjusted under 35 U.S.C. 154(b) by 544 days.

(21) Appl. No.: 17/123,760

(22) Filed: Dec. 16, 2020

(65) Prior Publication Data

US 2021/0105911 A1    Apr. 8, 2021

Related U.S. Application Data

(60) Provisional application No. 63/036,311, filed on Jun. 8, 2020.

(51) Int. Cl.
*H05K 7/20*         (2006.01)

(52) U.S. Cl.
CPC ..... *H05K 7/20254* (2013.01); *H05K 7/20418* (2013.01); *H05K 7/20509* (2013.01)

(58) Field of Classification Search
CPC .......... H05K 7/20254; H05K 7/20418; H05K 7/20509; H05K 7/20272; H05K 7/20772;
(Continued)

(56) References Cited

U.S. PATENT DOCUMENTS

| | | | |
|---|---|---|---|
| 10,842,043 B1 * | 11/2020 | Zhang | H05K 7/20254 |
| 2004/0104022 A1 * | 6/2004 | Kenny | F28F 13/06 |
| | | | 257/E23.098 |

(Continued)

FOREIGN PATENT DOCUMENTS

| | | |
|---|---|---|
| GB | 2576032 B | 4/2021 |
| GB | 2576030 B | 12/2021 |

(Continued)

OTHER PUBLICATIONS

"Wolverine Microcool High Performance Liquid Cooling CP-1001", 2016, 2 pages.

(Continued)

*Primary Examiner* — Stephen S Sul
*Assistant Examiner* — Jeffrey Francis Stoll
(74) *Attorney, Agent, or Firm* — Hanley, Flight & Zimmerman, LLC

(57) ABSTRACT

Examples described herein relate to a cold plate. In some examples, the cold plate includes a surface with fins and at least two channels, wherein a first channel is shaped with a first opening extending towards the surface, a second opening proximate and across a first fin attached to the surface, and a third opening from the surface and extending away from the surface. In some examples, when a fluid is provided to the first opening, the first opening directs the fluid towards the surface, the second opening directs the fluid across the first fin, and the third opening directs the fluid away from the surface. In some examples, the second opening comprises split openings around opposite sides of the first fin.

20 Claims, 32 Drawing Sheets

(58) Field of Classification Search
CPC ....... H05K 7/20236; G06F 1/20; G06F 1/206; H01L 23/427; H01L 23/473
See application file for complete search history.

(56) References Cited

U.S. PATENT DOCUMENTS

| | | | | |
|---|---|---|---|---|
| 2004/0206477 | A1* | 10/2004 | Kenny | F04B 17/00 257/E23.098 |
| 2006/0096738 | A1* | 5/2006 | Kang | F28F 3/022 257/E23.098 |
| 2016/0143185 | A1* | 5/2016 | Campbell | H05K 7/20218 165/104.31 |
| 2016/0234967 | A1* | 8/2016 | Choi | H05K 7/20927 |
| 2017/0105313 | A1* | 4/2017 | Shedd | H05K 7/20309 |
| 2018/0320993 | A1* | 11/2018 | Parag | F28F 3/02 |
| 2020/0404811 | A1* | 12/2020 | Qu | H05K 7/20254 |
| 2021/0320050 | A1 | 10/2021 | Robinson et al. | |

FOREIGN PATENT DOCUMENTS

| | | |
|---|---|---|
| GB | 2597525 A | 2/2022 |
| GB | 2601357 A | 6/2022 |

OTHER PUBLICATIONS

Bower, George S., Ritter, Keith; "How BMW and LG Chem Surpass Tesla's Battery Thermal Management System", https://www.gm-volt.com/threads/how-bmw-and-lg-chem-surpass-teslas-battery-thermal-management-system.337853/, Dec. 2015, 21 pages.

Singh, Randeep, "Fujikura Thermal Technology Overview", Thermal Technology Division, Fujikura Ltd., Tokyo, 2013, 25 pages.

Wang, Yan; Gao, Qing; Wang, Guohua; Lu, Pengyu; Zhao, Mengdi; Bao, Wendi, "A review on research status and key technologies of battery thermal management and its enhanced safety," International Journal of Energy Research, Jun. 2018, 27 pages.

* cited by examiner

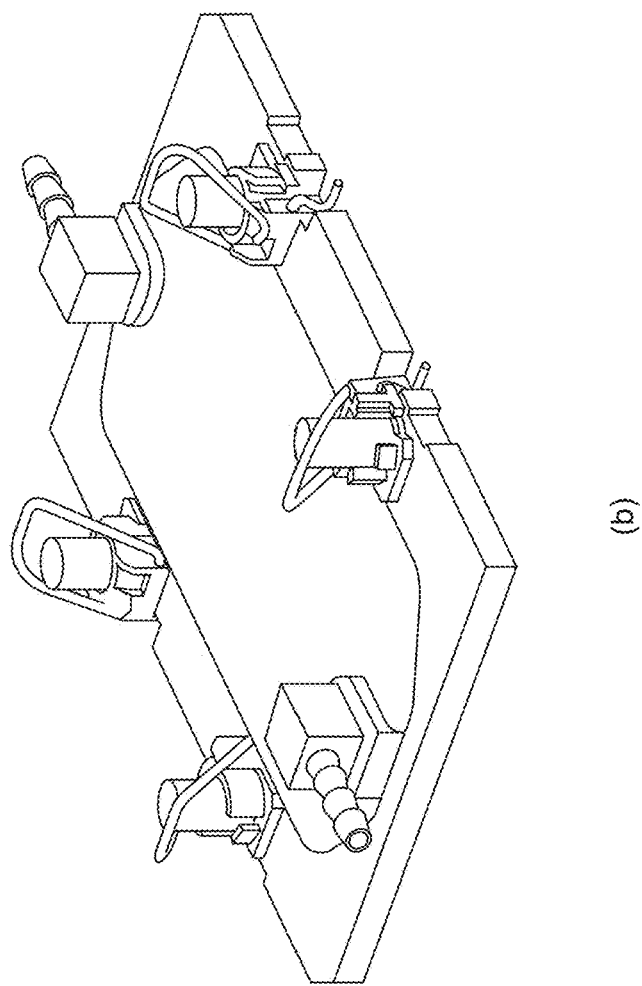
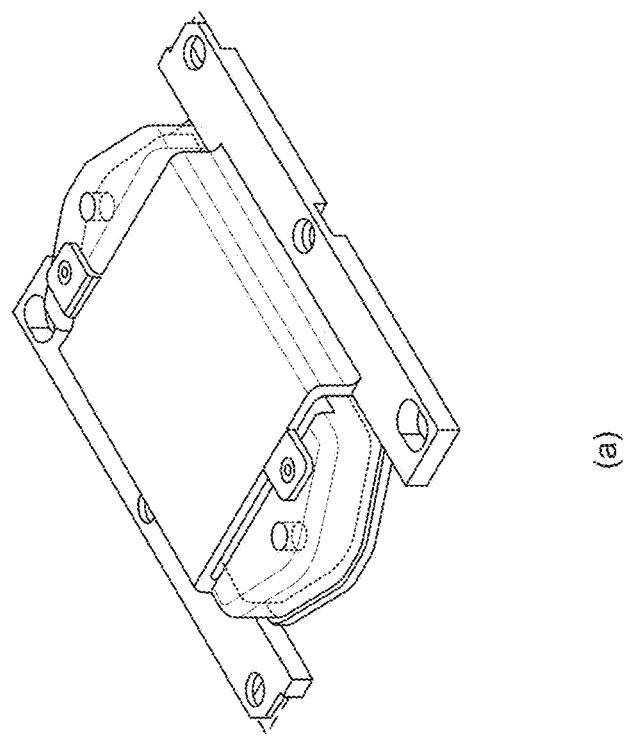
FIG. 1

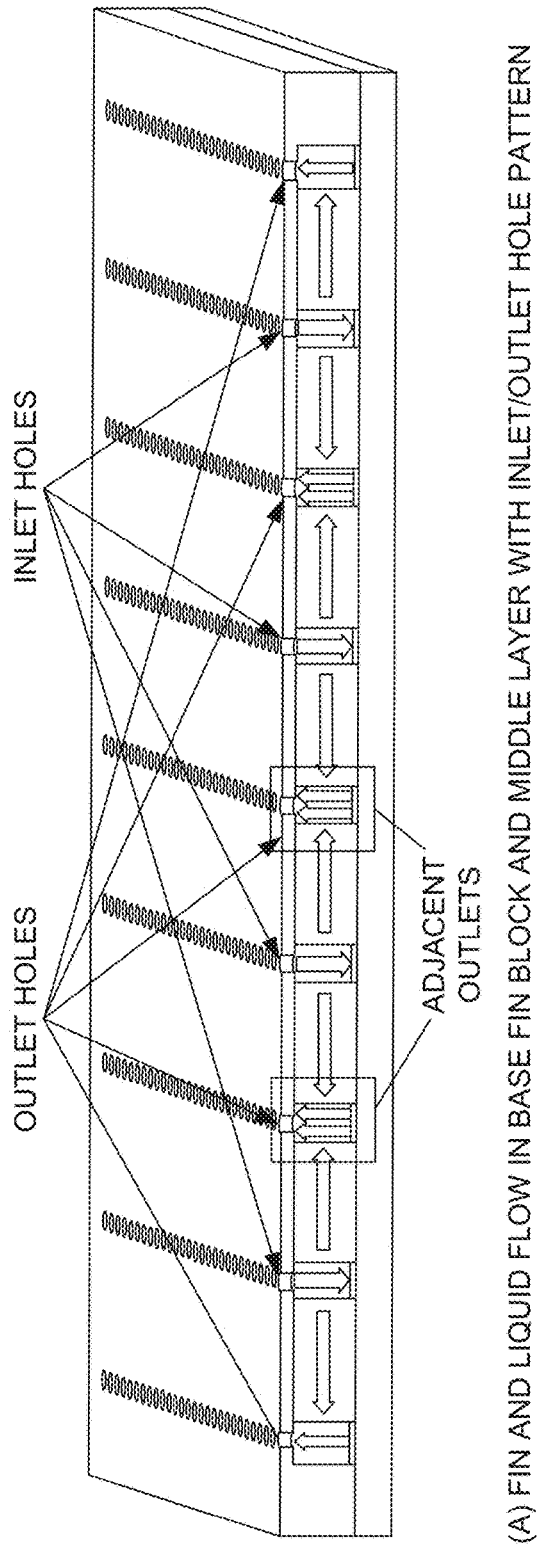
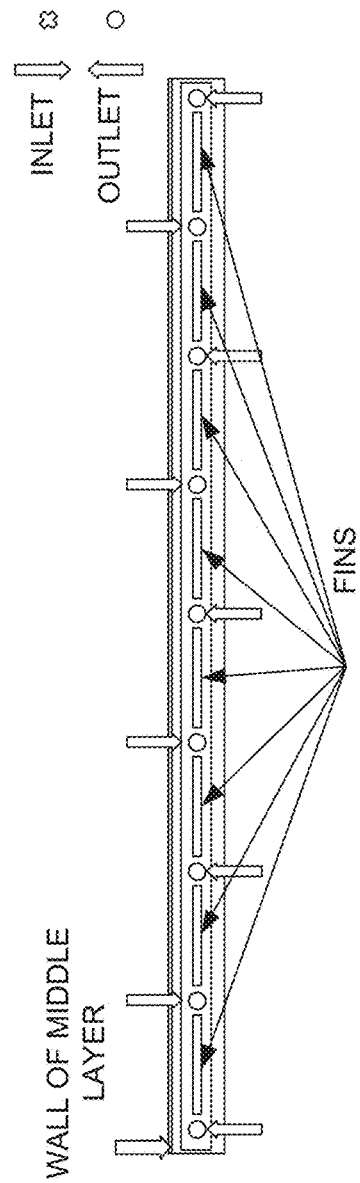
FIG. 6A (C) TOP DOWN VIEW OF INLET AND OUTLET HOLES AND CORRESPONDING FLOW DIRECTION

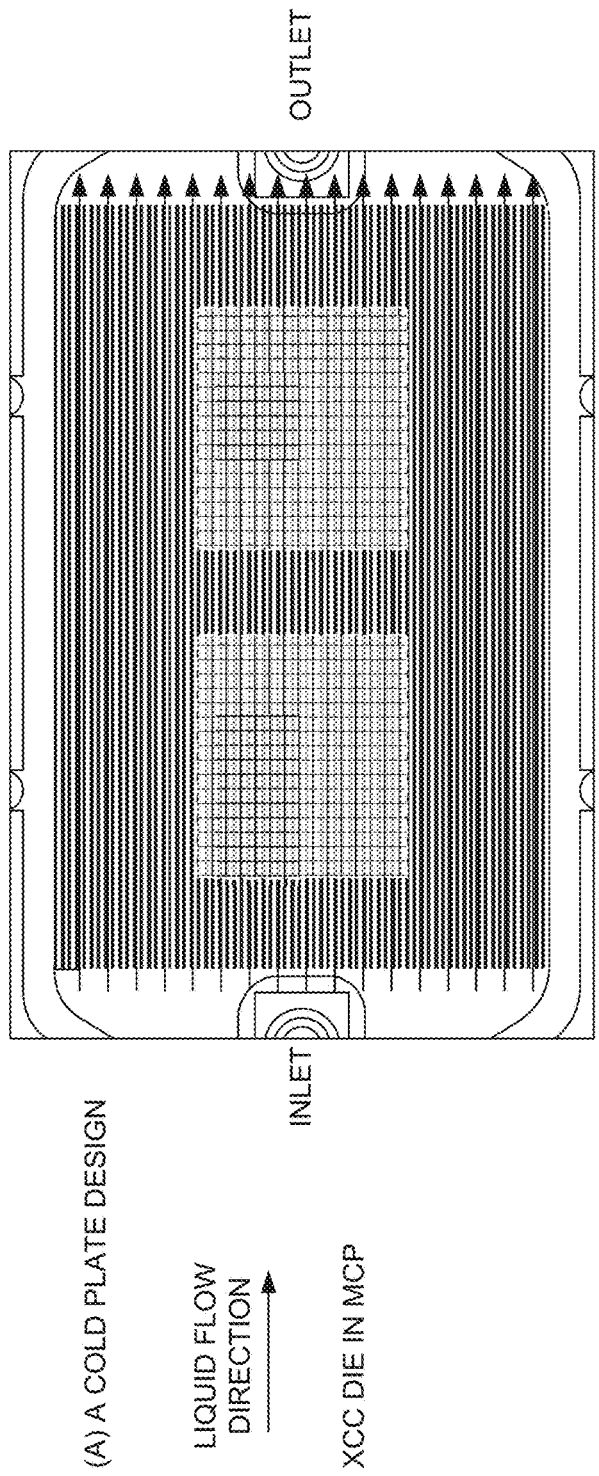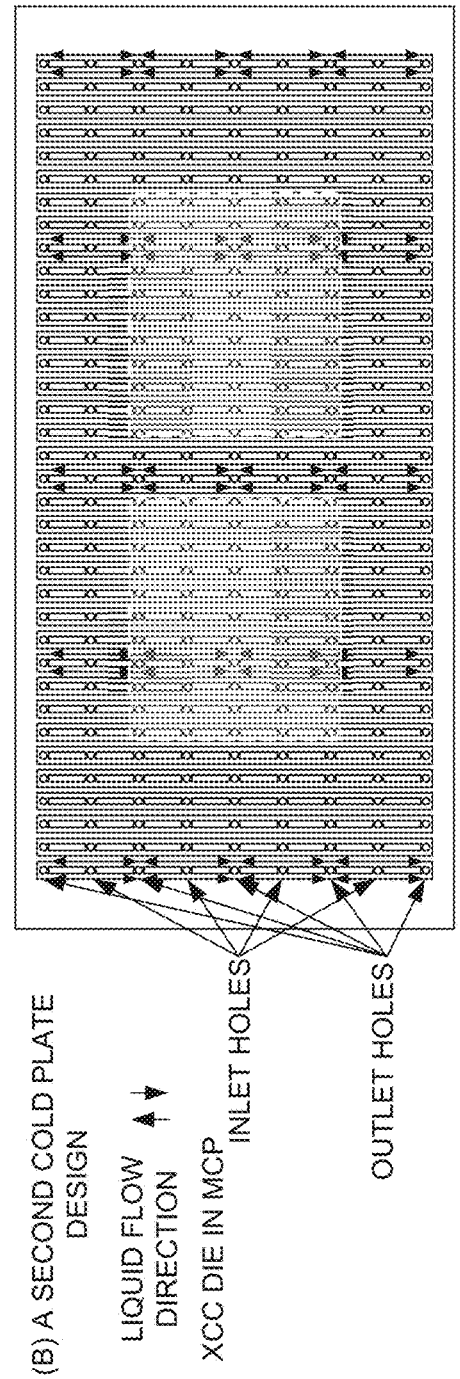
FIG. 8

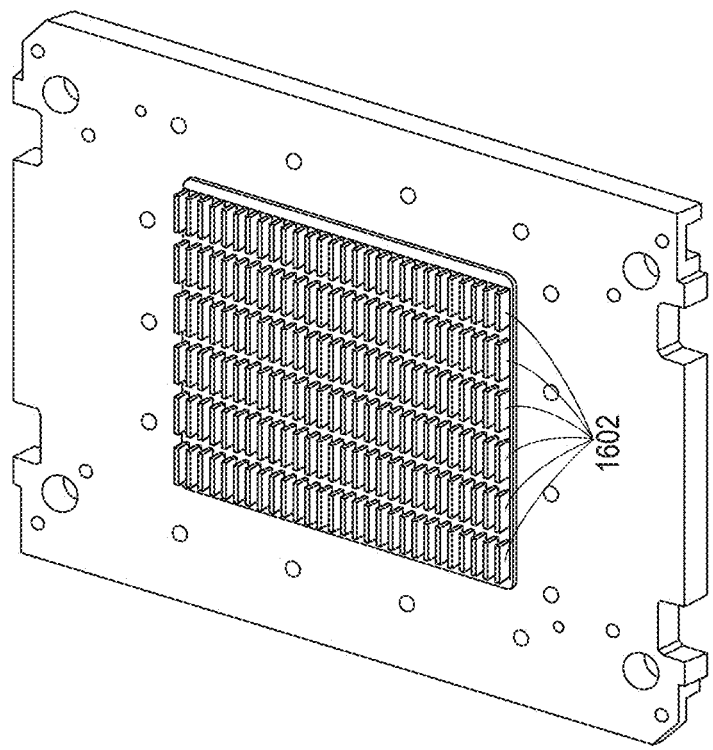
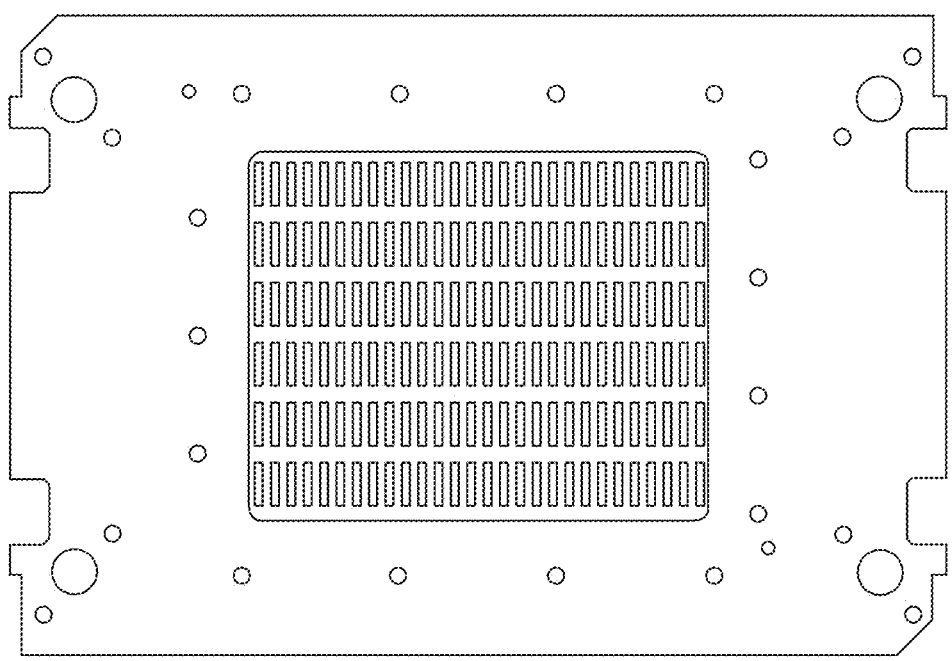
FIG. 16

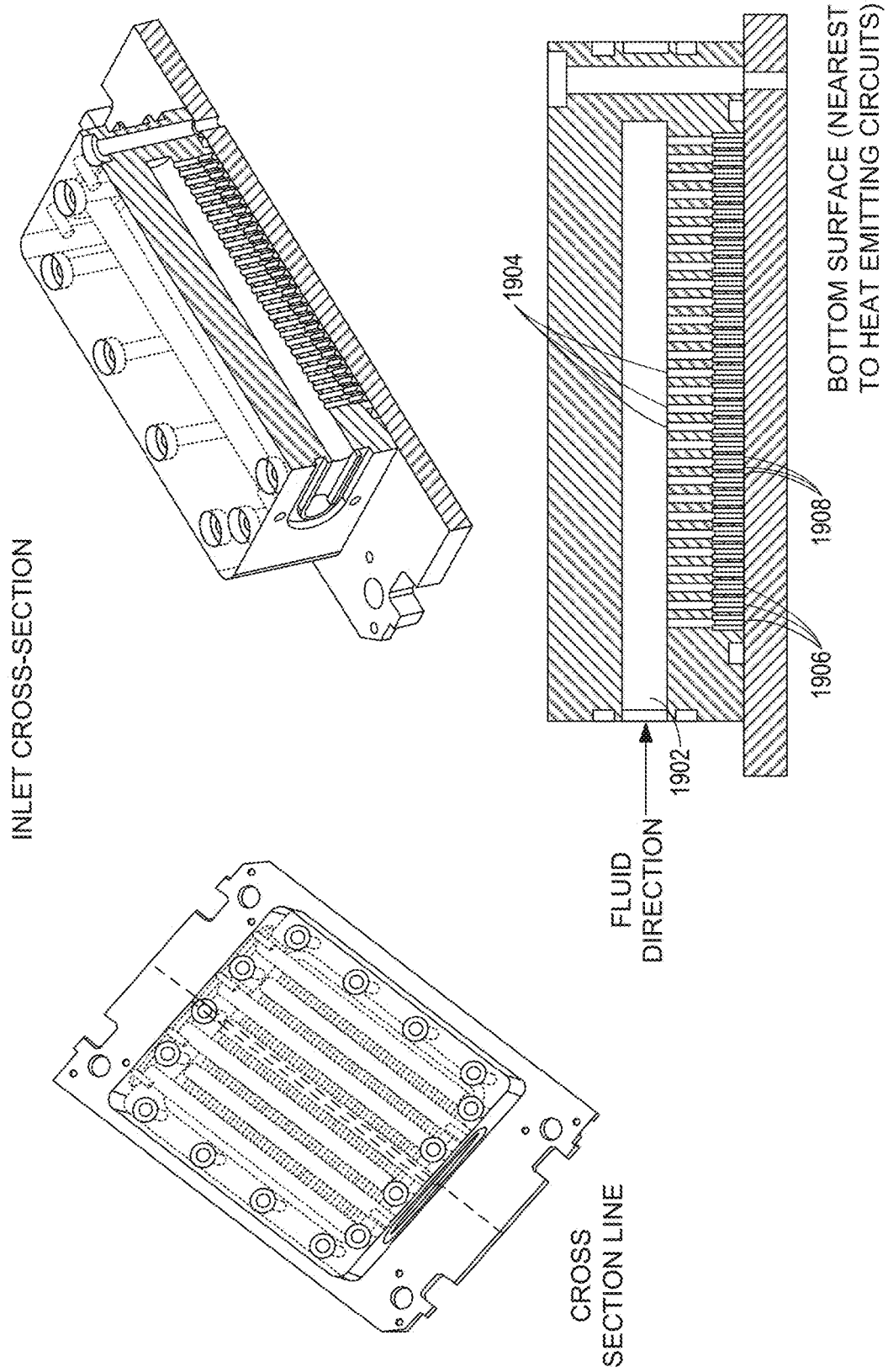

COLD PLATE ARCHITECTURE FOR LIQUID COOLING OF DEVICES

RELATED APPLICATION

This application claims the benefit of priority of U.S. Provisional application 63/036,311, filed Jun. 8, 2020. The contents of that application is incorporated in its entirety herein.

DESCRIPTION

With increasing thermal design power (TDP) of central processing units (CPUs) and other components, including, but not limited to memories, accelerators, and storage devices, the overall power consumption of each chassis and rack in a data center is projected to increase dramatically. Cloud computing and high-performance computing (HPC), artificial intelligence (AI), machine learning (ML) could further push for a higher performance and TDP to meet increasing computing needs.

TDP of processors is expected to continue to increase. At the same time, the power density of CPUs could jump to as high as 500 W/cm$^2$ on local spots. Thus, from a CPU component level perspective, air cooling is expected to reach its limit soon for data center. Meanwhile, the total power is projected to increase to 50 KW per rack. From a system level perspective, air cooling is also expected to reach its cooling capacity limit soon or later for data center. This is especially true for 1U 2S (2 socket) or 4S (4 socket) systems. One rack unit (1U) can be 44.45 mm (1.75 in) in height. 2U can represent two rack units.

BRIEF DESCRIPTION OF THE DRAWINGS

FIG. 1 depicts cold plate designs.

FIG. 6A shows an assembled base fin block and middle layer and flow direction of liquid in fin block and middle layer assembly.

FIG. 8 shows a comparison of a reference cold plate design and cold plate design in accordance with various embodiments.

FIG. 16 depicts perspectives of a base fin block with protruding fins.

FIG. 19 depicts an example cross section showing a delivery of fluid from the inlet channel towards an end of a fin or fins.

DETAILED DESCRIPTION

For example higher power and higher temperature devices are being driven by the performance need for High-Performance Computing (HPC), AI, and high-end applications. CPUs are expected to reach 500 or more Watts in TDP for next generation platforms. For GPU and AI chips, the TDP also see a similar increasing trend to 800 W or more range.

Liquid cooling has been proposed to help address increasing TDP for CPU and overall system power of data center due to its inherent advantage of larger specific heat (e.g., three orders of magnitude higher than that of air). Liquid cooling can be used in a data center or edge network element to cool server CPU, GPU, artificial intelligence (AI) chips and non-CPU components. There are at least two major types of liquid cooling: 1) indirect contact (e.g., cold plate where liquid is contained in the cold plate and the liquid does not contact a device to be cooled)) and 2) direct contact (e.g., immersion) whereby a device to be cooled contacts liquid directly. The cold plate based liquid cooling is widely used for liquid cooling of data centers.

For indirect cold plate based liquid cooling for a platform, as shown in FIG. 1 (*a*), the cold plate is utilized to mount a lidded package onto a circuit board. FIG. 1 (*b*) depicts an example cold plate without a bracket that can accommodate a loading mechanism for a socket. However, a bracket can provide structural stiffness and resistance to chip bending.

Figure 2:
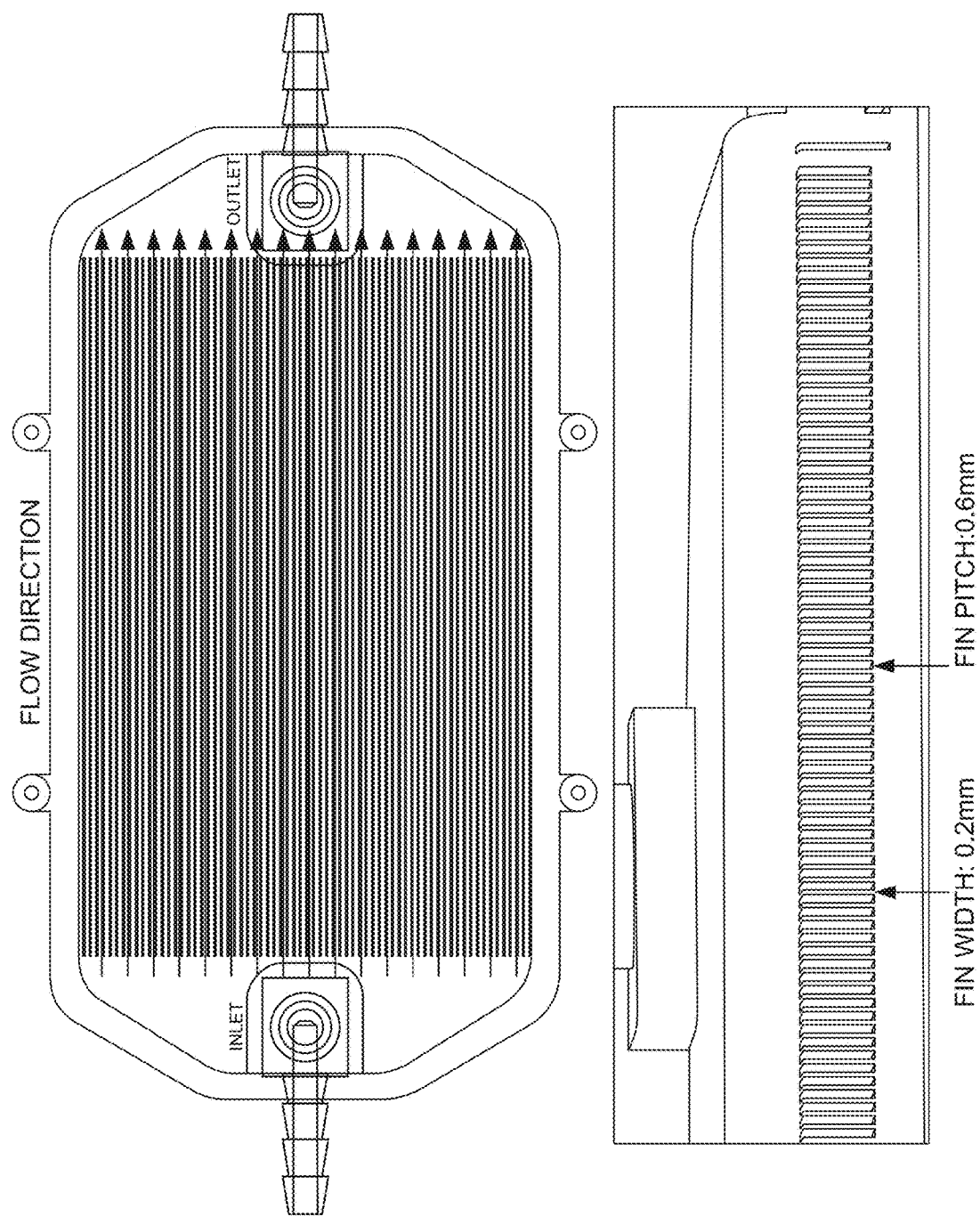
FIG. 2 depicts an example of a straight fin cold plate design.

FIG. 2 depicts an example of a straight fin cold plate design. Straight fins can be fabricated using machining or skiving process between the inlet and outlet and liquid flows along the straight fins from the inlet to the outlet. Heat emitting devices can be cooled by liquid flowing through the fins.

Figure 3:
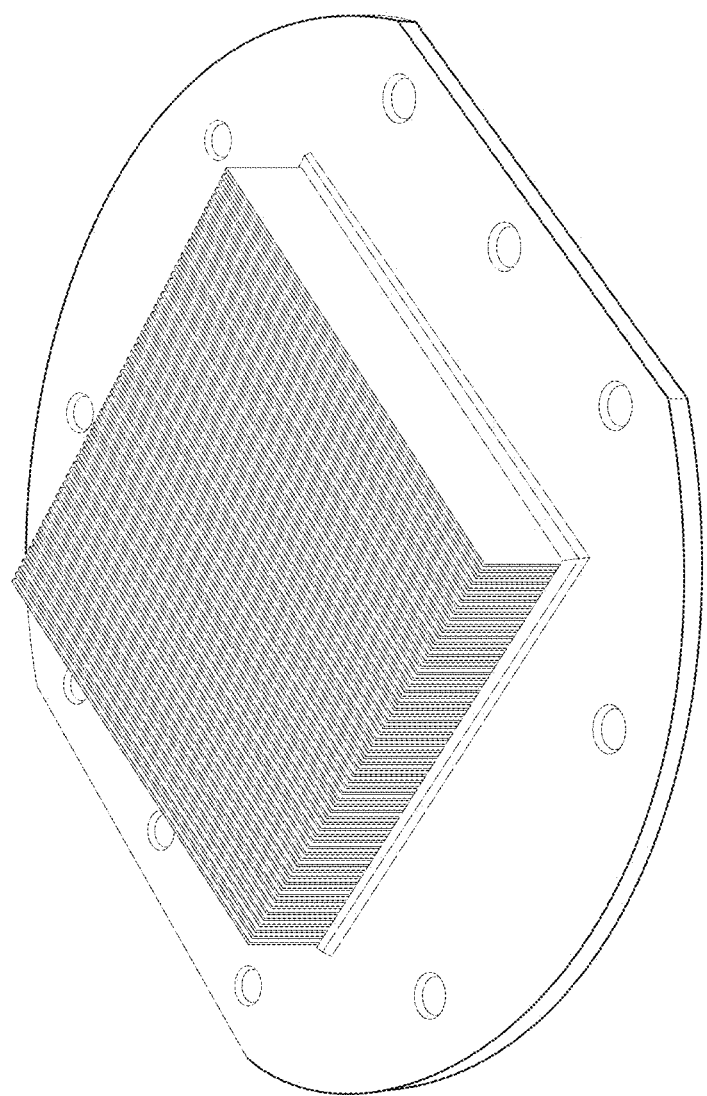
FIG. 3 shows cold plates from that follow a straight fin architecture.

FIG. 3 shows a cold plate that provides a straight fin architecture. Existing cold plate design with straight fins can have the following disadvantages. With increasing die size or floor plan for a server CPU and complexity of die placement for a Multi-Chip Package (MCP) combined with increasing CPU power, liquid is preheated after flowing near a first device before flowing near a second device, which introduces large temperature gradient to silicon die, or die-to-die in MCP package. For example, under a flow rate of 1 liter/minute (L/M), one MCP package with 2 XCC die (270 W each, 540 W in total, uniform power map) in MCP configuration can have a temperature gradient as large as 25° C. across 2 XCC die with a spacing of 4.0 mm. This will affect the thermal performance of liquid cooling, resulting in server CPU binning and a performance down-grade for high performance CPUs, GPUs, AI chips or other devices.

Meanwhile, for a MCP with multiple dies (e.g., CPU, GPU, memory, accelerator) placed on a substrate, die pairing during fabrication and assembly process may be constrained since die chiplets show different temperatures and temperature gradient in usage. At a customer side, when end users loan or purchase cores or virtual machines (VM), end users might see different core or VM performance based on locations of cores or die chiplets. Different temperature and temperature gradient can affect server and GPU chip performance for end users.

Figure 4:
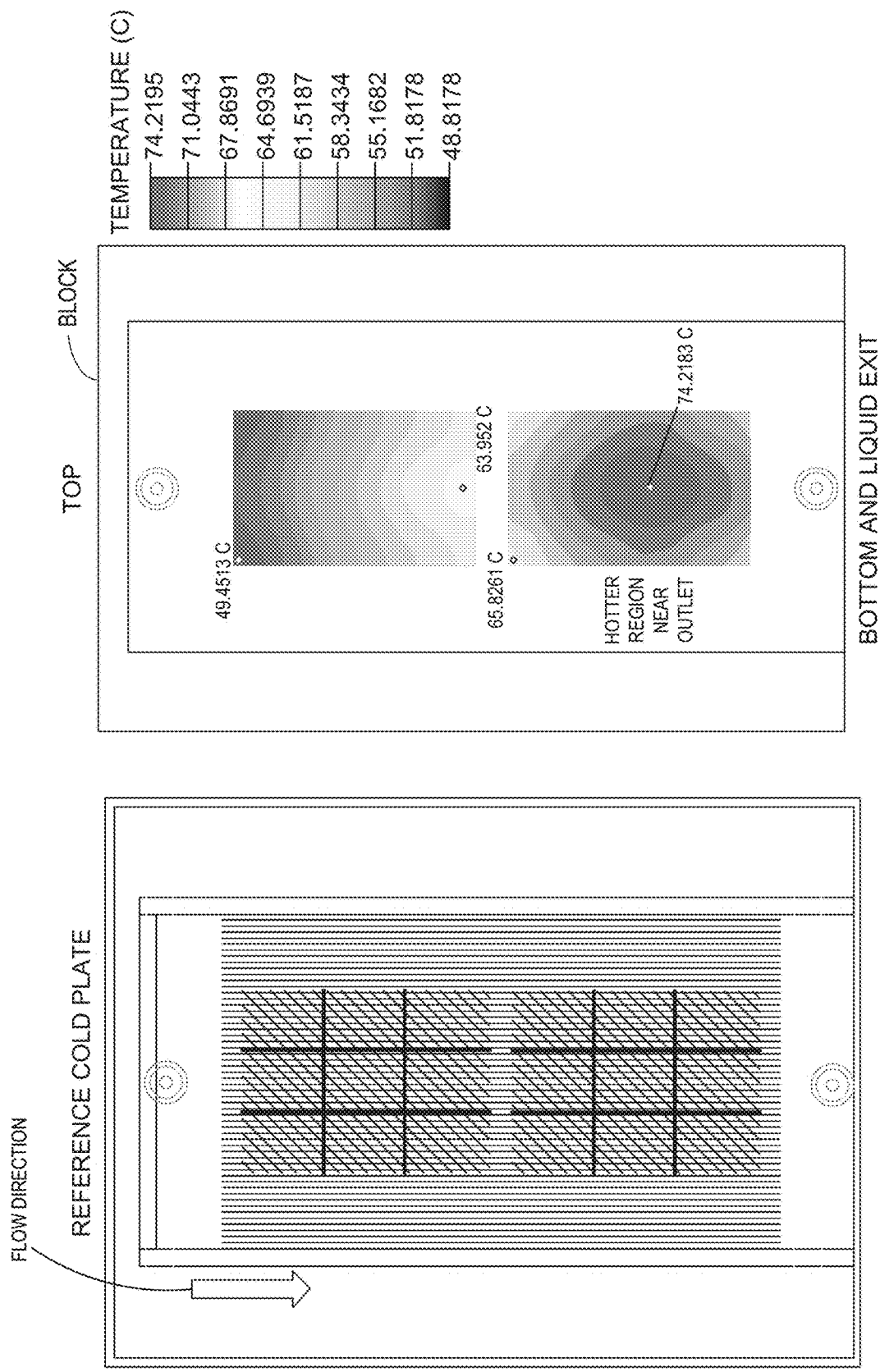
FIG. 4 shows a temperature gradient example.

FIG. 4 shows a temperature gradient of one example MCP package with 540 W TDP in cold plate based liquid cool using straight fin design. The temperature gradient and temperature concentration is shown for coolant that flows from top to bottom. The bottom region is the hottest region as the cooling liquid heats as it travels in proximity to heated circuits from top to bottom. The cooling liquid can be hottest at the bottom portion of the cold plate and offer the least amount of cooling to circuits that are positioned near the exit of the liquid from the cold plate.

In order to further improve thermal performance of a cold plate, like Psi_cl (e.g., thermal resistance between lidded package case to local liquid ambient, a parameter to judge thermal performance of one cold plate design), a higher flow rate could be used, but flow rate is limited by coolant distribution unit (CDU) and high-end CDU can involve a much higher cost, resulting in dramatic increase of total cost of ownership (TCO) for a customer or in data center.

Normally, fine fin thickness and pitch are required to achieve desired performance. As shown in in FIGS. 2 and 3, the fin width and pitch are typically 0.2 mm and 0.4/0.6 mm in design of cold plates fora server CPU/GPU/AI chip. A quality issue can arise with cold plates using this design rule as fine feature dimensions may not be achieved, which affects thermal performance and reliability of cold plates in field usage.

Various embodiments provide a manifold integrated cold plate architecture that increases cooling capability of liquid cooling for servers or other devices. Various embodiments provide a cold plate architecture which incorporates bottom fin layer, middle layer for coolant split and manifold for coolant distribution to improve cooling capability of cold plate based liquid cooling for servers. According to various embodiments, a fin array is perpendicular to the long side of server package or long side of floor plan instead of being parallel to it.

Various embodiments can improve cooling capability of liquid cooling over traditional cold plates by reducing Tj (e.g., junction temperature of silicon die) of silicon die by additional 15+° C. for a 500 W TDP MCP package compared to traditional cold plates. Various embodiments can reduce in-die or die temperature within an MCP package by 40% and above in liquid cooling. Various embodiments can reduce thermal constraint on die pairing during manufacturing process (both in fabrication and assembly) resulting in a better yield of dies and electronic packages for server CPU or GPU.

Various embodiments relax requirements of the fin pitch down to 1.0 mm range and fin width in the fin bank in the manufacturing process of cold plates, which can reduce a cost of manufacturing fins. According to various embodiments, a corresponding manufacturing process and material set are provided for various embodiments to minimize cost of constructing the cold plate.

Figure 5:
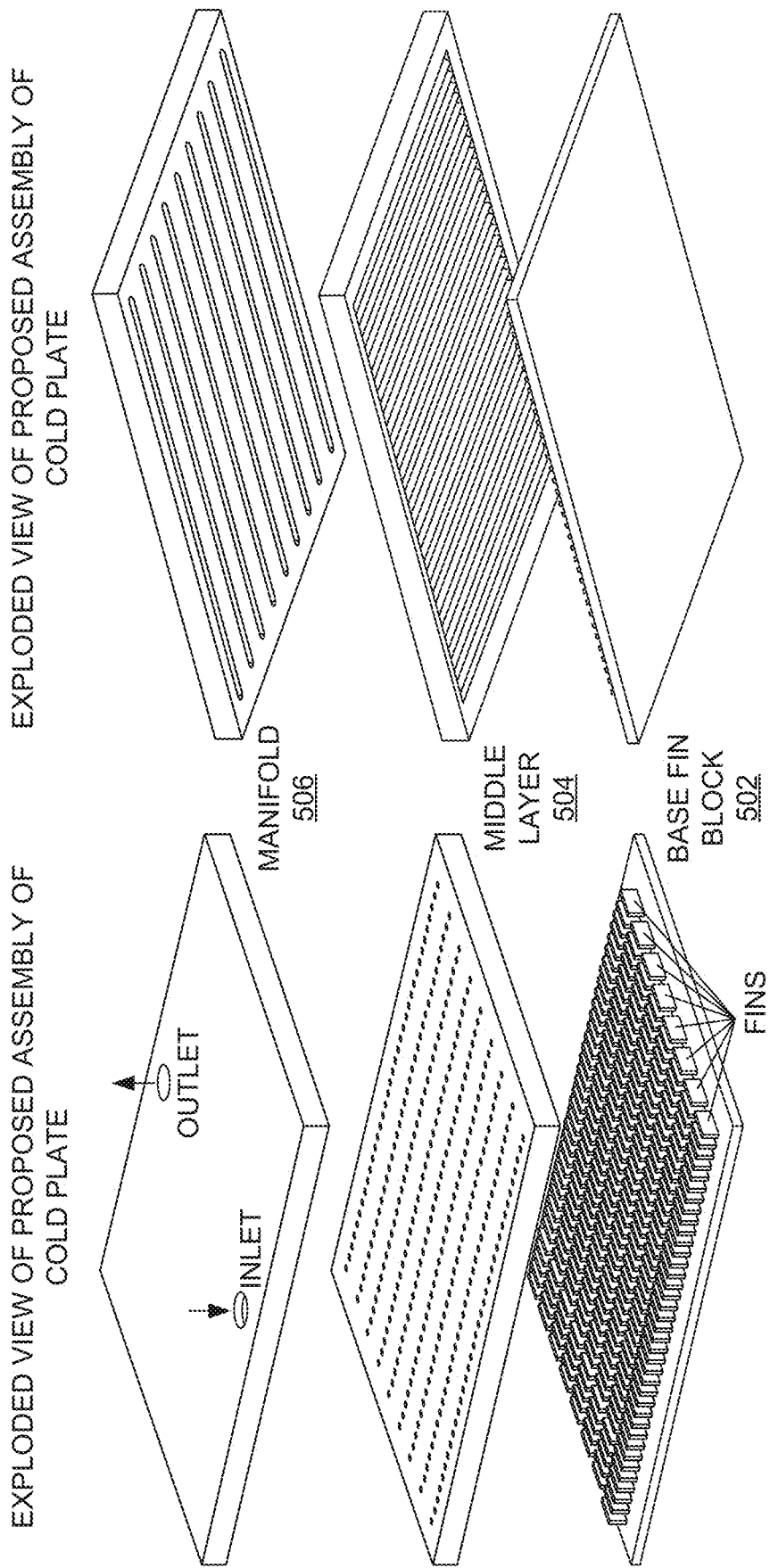
FIG. 5 shows an example cold plate architecture which incorporates a bottom fin layer, middle layer and manifold.

FIG. 5 shows an example cold plate architecture which incorporates a bottom fin layer, middle layer and manifold. Components of a cold plate can include base fin block 502, middle layer 504 and manifold 506. Manifold 506 can distribute liquid into a hole array in middle layer 504, and then spit through middle layer to fin bank in base fin block 502. In other embodiments, one, two, or four or more components can be used. Manifold layer 506 can provide at least one inlet and at least one outlet for fluids. A number of inlets and outlets may or may not be correlated to TDP of the dies that are to be cooled. A number of inlets and outlets and diameters of inlets and outlets can control fluid speed but may be limited by manufacturing complexity and cost.

Manifold layer 506 can provide channels to direct inlet liquid to holes of middle layer 504 and direct liquid from holes of middle layer 504 to the outlet. Middle layer 504 can provide holes or channels to direct liquid from channels of manifold 506 to fins an holes or channels to direct liquid that traversed across fins to channels that provide the liquid (e.g., heated liquid) to the outlet through channels of manifold 506. Fluids or liquids can include one or more of: water, process chilled water, glycol, glycol and water, or water and an inhibitor. Fluids or liquids can be refrigerated prior to being provided to the inlet. Middle layer 504 and manifold 506 can be manufactured from high thermal conductivity metals or other materials (e.g., steel, stainless steel, copper, aluminum, and so forth). Middle layer 504 can be affixed to base fin block 502 by epoxy, chemical bonding, welding, screws, O ring or sealant to prevent liquid from escaping.

Base fin block 502 can have protruding affixed fins. Fins can be solid copper, aluminum, or other metal or include graphite inside the fin. Base block 502 and fin can be made of copper or other metal or copper alloy or aluminum.

Figure 6B:
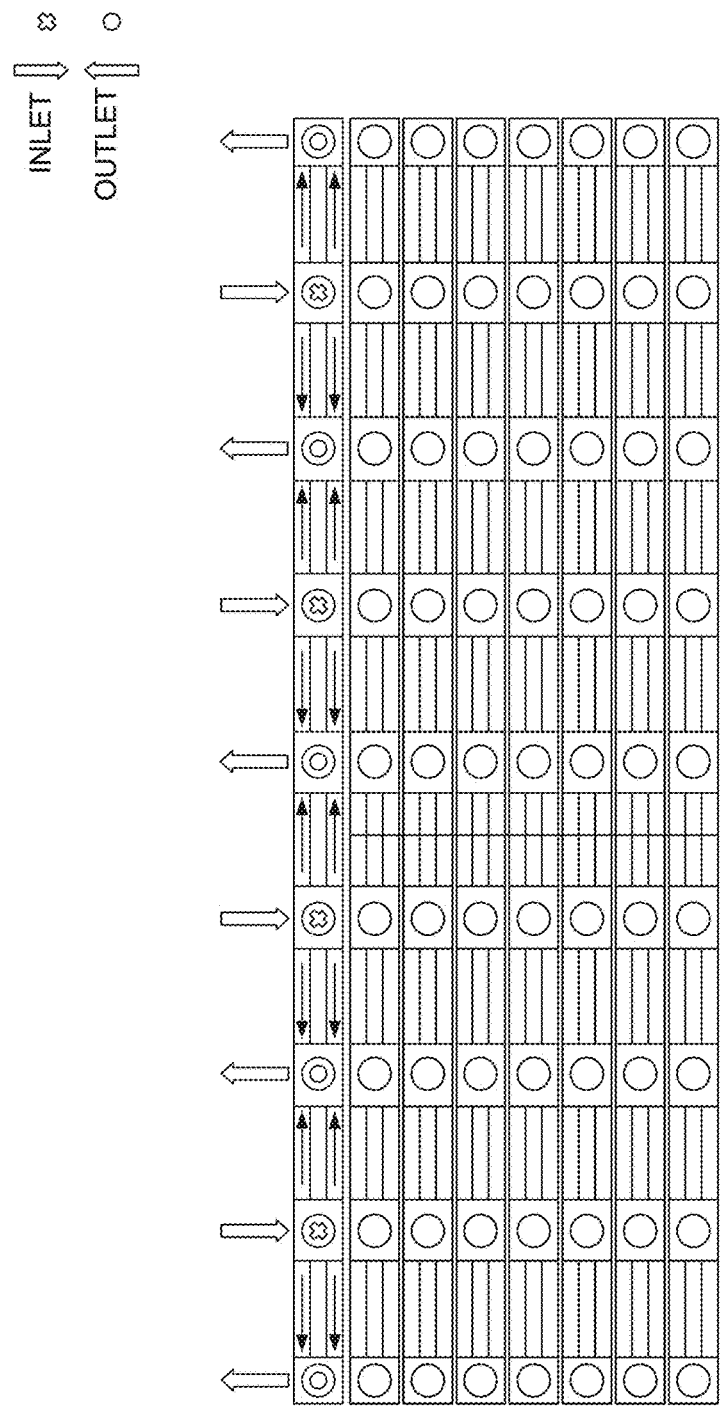
FIG. 6B shows a configuration of fins, inlet/outlet holes, and liquid flow of a cold plate design of various embodiments from a top-down perspective.

FIG. 6A shows an assembled base fin block and middle layer and flow direction of liquid in fin block and middle layer assembly. The fins in the base fin block can be arranged perpendicular to the floor plan and die placement of a server package. The fins can be perpendicular (e.g., 90 degrees) to the bottom surface (e.g., non-planar) in some examples. In some examples, one or more fins can be angled (e.g., 15, 30, 45, 60 or other angles) relative to the bottom surface (e.g., non-planar) in some examples. FIG. 6B shows a configuration of fins, inlet/outlet holes, and liquid flow of a cold plate design of various embodiments from a top-down perspective.

Liquid can be guided to flow into an array of inlet holes, flow across a left fin and right fin, and then flow out of an array of the outlet holes. The inlet holes and outlets holes in the middle layer can be placed adjacently as shown in FIGS. 6A and 6B. Each inlet/outlet hole array can be separated by a wall or separator in the middle layer, so the liquid is constrained to flow in each split region of a row of fins and not flow into another row of fins submerged in a liquid region to eliminate mix of liquid flowing across fins.

Figure 7A:
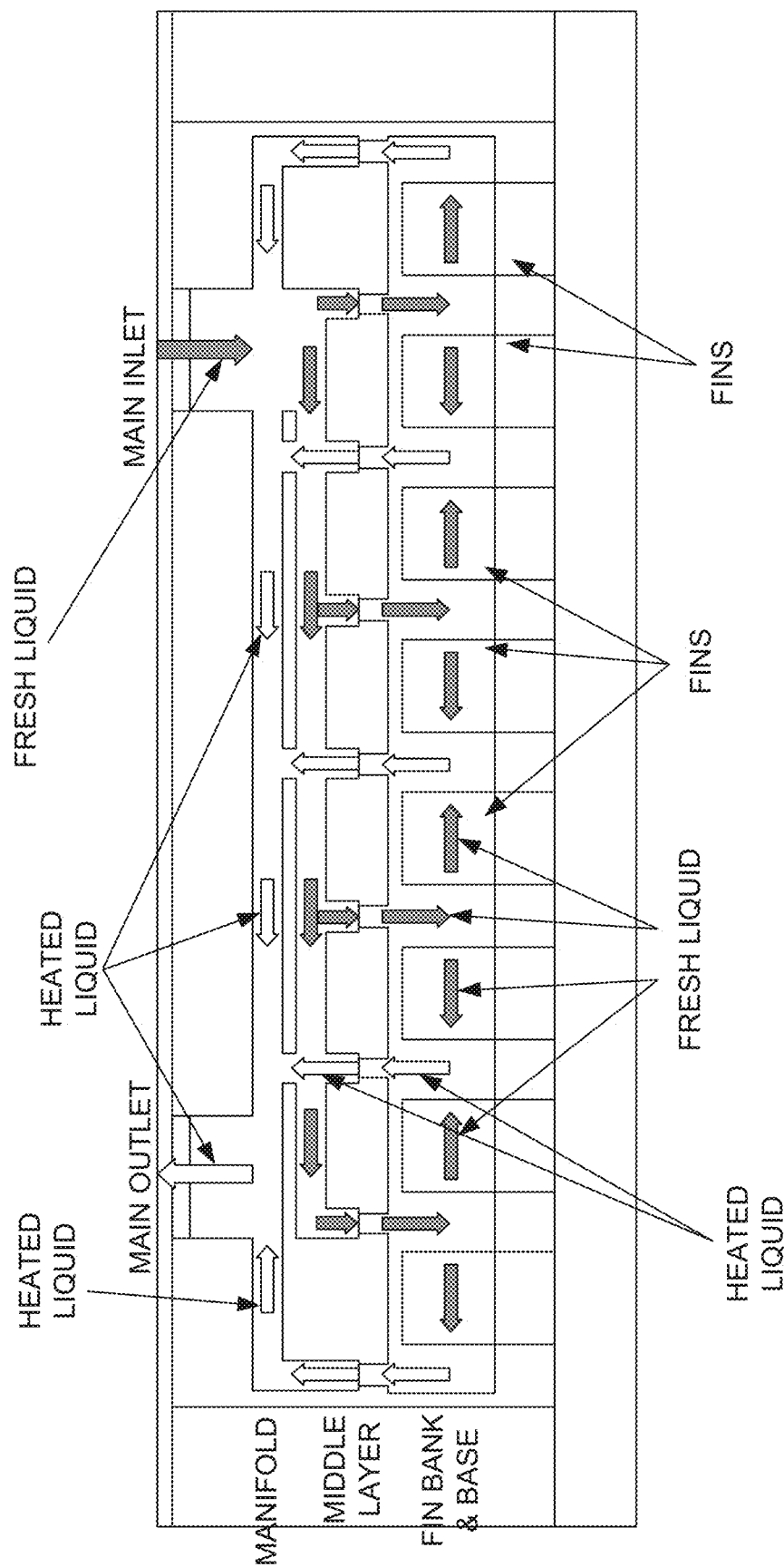
FIG. 7A shows liquid flow diagram of the cold plate architecture with integrated manifold.

FIG. 7A shows liquid flow diagram of the cold plate architecture with integrated manifold. The blue arrows indicate inlet flow and orange color arrows indicate outlet flow direction. The liquid flows into the main inlet and is distributed into liquid distribution layer, and then flows into individual inlet holes. The liquid flows thorough fins in the fin bank and then flows out through array of outlet holes, then flows back to main outlet through the distribution layer for return flow.

Liquid can flow in a U-shaped direction down towards a bottom surface of the cold plate, across the fins, and up and away from the fins towards the outlet. Channels can separate fresh fluid, fresh unheated liquid (e.g., coolant) and heated liquid or heated fluid. According to various embodiments, liquid is split into multiple zones separated by the walls or separator of a middle layer. In each zone, there is an array of inlet holes and outlet holes to flow through fin arrays. So, the fin direction and flow direction are perpendicular to that in reference or typical cold plate design. Devices on a circuit board (e.g., CPU, memory, GPU, accelerator, and/or storage) can emit heat that is absorbed into the cold plate and its fins and the heat can be absorbed by the fresh unheated liquid and heated liquid or fluid. Fresh liquid can traverse surfaces of fins (e.g., top and opposite sides) and become heated liquid.

According to various embodiments, liquid flows a short distance in each pair of inlet/outlet or fin. This length of each fin can be 5.0 mm (or other sizes) as compared to over 70.0 mm to cover maximum floor plan for a current cold plate design. According to various embodiments, a minimum feature size (e.g., thickness of the fins or the gap between the fins) can be 0.8 mm as compared to 0.2 mm in some examples of a reference cold plate design.

Figure 7B:
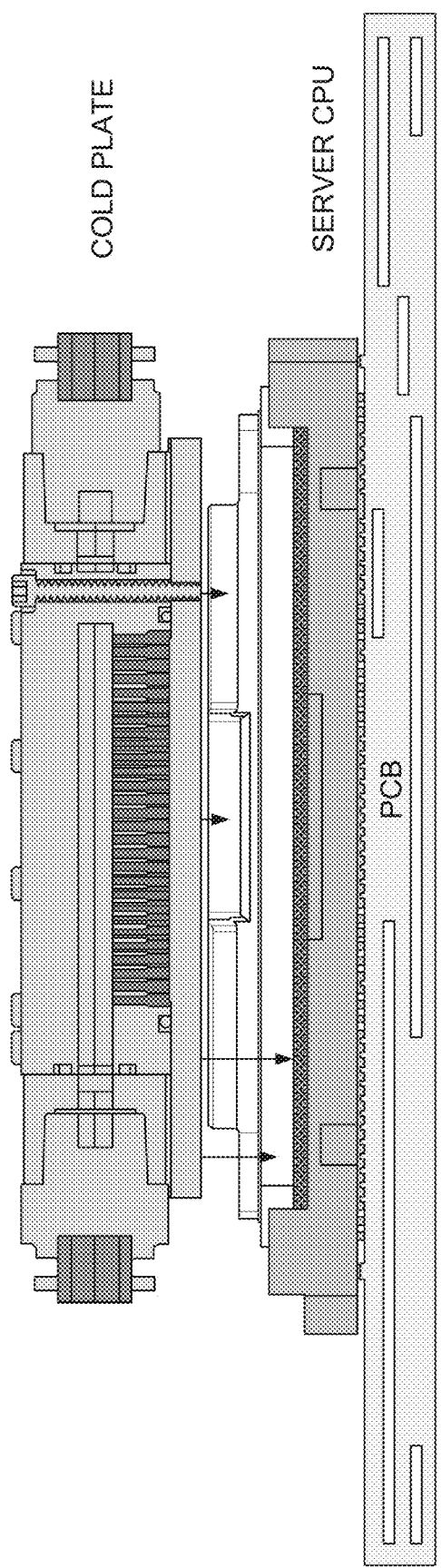
FIG. 7B shows circuits underneath cold plate and relationship to bottom of cold plate.

FIG. 7B shows a system with a cold plate and circuits underneath the cold plate. For example, the cold plate can be attached above the server CPU. The server CPU can be conductively coupled to a printed circuit board (PCB) for coupling to other components.

FIG. 8 shows a thermal analysis of (a) a reference cold plate design and (b) a cold plate design in accordance with various embodiments. Thermal analysis was conducted using ANSYS® Icepak® for both the cold plate design and the reference design using an MCP package with 2 XCC dies spaced by a 4.0 mm pitch. XCC can represent a die with attached circuits. In this example, the power of each XCC die is 270 W with 540 W for TDP of this MCP package. Table 1 summarizes boundary conditions and assumptions used in this study to quantify a thermal benefit of a cold plate according to various embodiments.

TABLE 1

| Boundary conditions and assumptions used in thermal analysis | |
|---|---|
| Package | 2* XCC die MCP package on socket XE. TCP: 540 W TIM1: solder thermal interface material (STIM) |
| Design of reference cold plate | Fin thickness: 0.2 mm Fin pitch: 0.6 mm Material: copper |
| Design of cold plate in some embodiments | Keep in volume (KIV) same as that of reference cold plate Example fin pitch: 2 mm in long edge direction, 6.5 mm in short edge direction (liquid flow direction) Example fin width: 0.6 mm Example hole diameter: 1.0 mm Example material: copper |
| Flow rate | 0.7-2.5 L/M, typical range of interest: 0.7-1.2 L/M |
| TIM2 | Thermal interface material between package lid and cold plate. TIM2 can be grease. |

Figure 9:
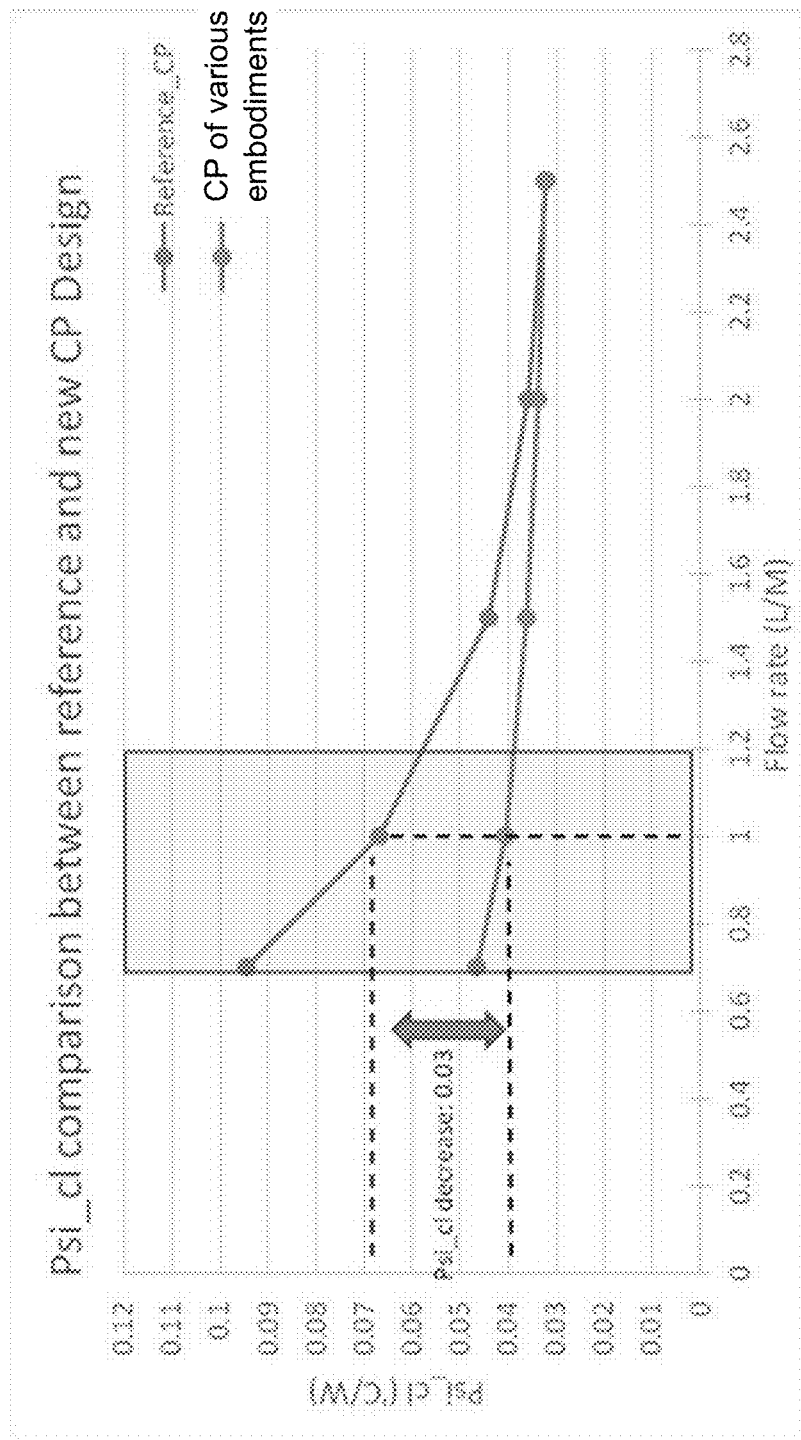
FIG. 9 shows an example comparison of Psi_cl between various coldplate designs.

FIG. 9 shows an example comparison of Psi_cl between a coldplate according to various embodiments and a reference cold plate. For liquid flow rate in range of interest: 0.7-1.2 L/M, there is obvious Psi_cl improvement for a cold plate (CP) according to various embodiments versus a reference CP. At a flow rate of 1.0 L/M, Psi_cl improved by ~0.03° C./W for cold plate proposed in various embodiments versus reference CP, resulting in Tj reduction by 15° C. for 540 W SKU and a potential 2 to 3 bin upsides for CPU or GPUs. At a flow rate of 0.7 L/M, this Psi_cl improvement is increased to 0.05° C./W, resulting in ~27° C. Tj reduction for 540 W TDP SKU.

In order to achieve same thermal performance of proposed CP at flow rate of 0.7 L/M, a flow rate of 1.5+L/M is required for reference one, and it will dramatically increase TCO of data center (e.g., coolant distribution unit (CDU) cost, higher operation cost with over double liquid rate).

A parameter of interest is in-die temperature gradient and overall die temperature gradient because it can affect potential die pairing in MCP manufacturing and assembly process. If there is a large in-die temperature gradient (e.g., variation, change or difference in temperature) and overall die temperature gradient, power variation may be limited among dice for the same type if silicon dies in die pairing. Reducing this temperature gradient can offer more flexibility in die selection for die pairing, resulting in improving yield for silicon die manufacturing in the fabs and package assembly in factories.

Figure 10:
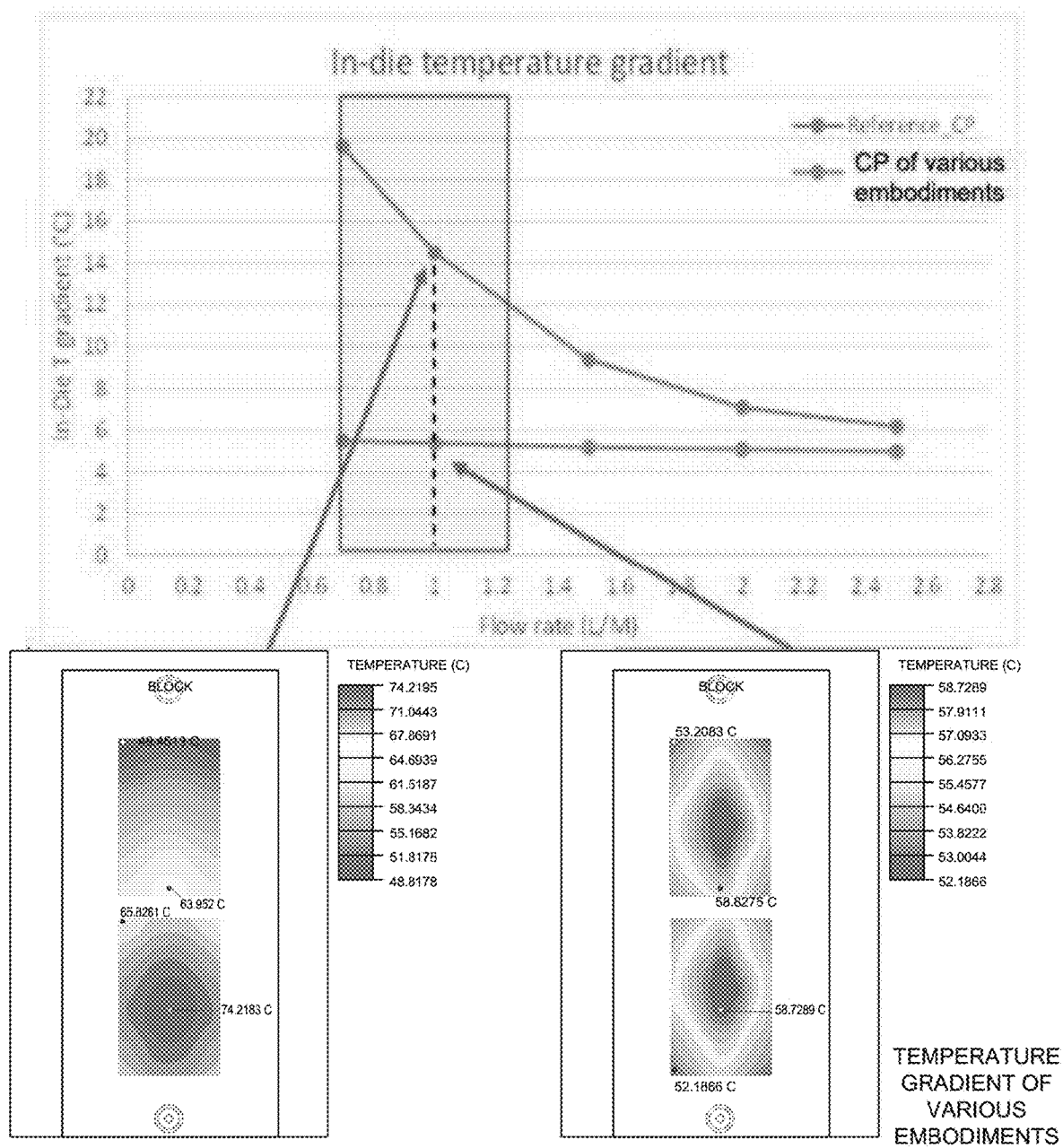
FIG. 10 shows a comparison of in-die temperature gradients.

FIG. 10 shows a comparison of in-die temperature gradient of 2*XCC MCP between a cold plate according to various embodiments and reference cold plate. At a flow rate of 1.0 L/M, the in-die temperature gradient is reduced by 3 times, dropping from 14.5° C. down to 4.5° C. with various embodiments. Various embodiments provide almost no difference in in-die temperature gradient between these two XCC dies, and potentially eliminates pre-heating effect on liquid flow to downstream dies and relaxes a constraint on power variation among dies in die pairing in die manufacturing and MCP assembly process.

Figure 11:
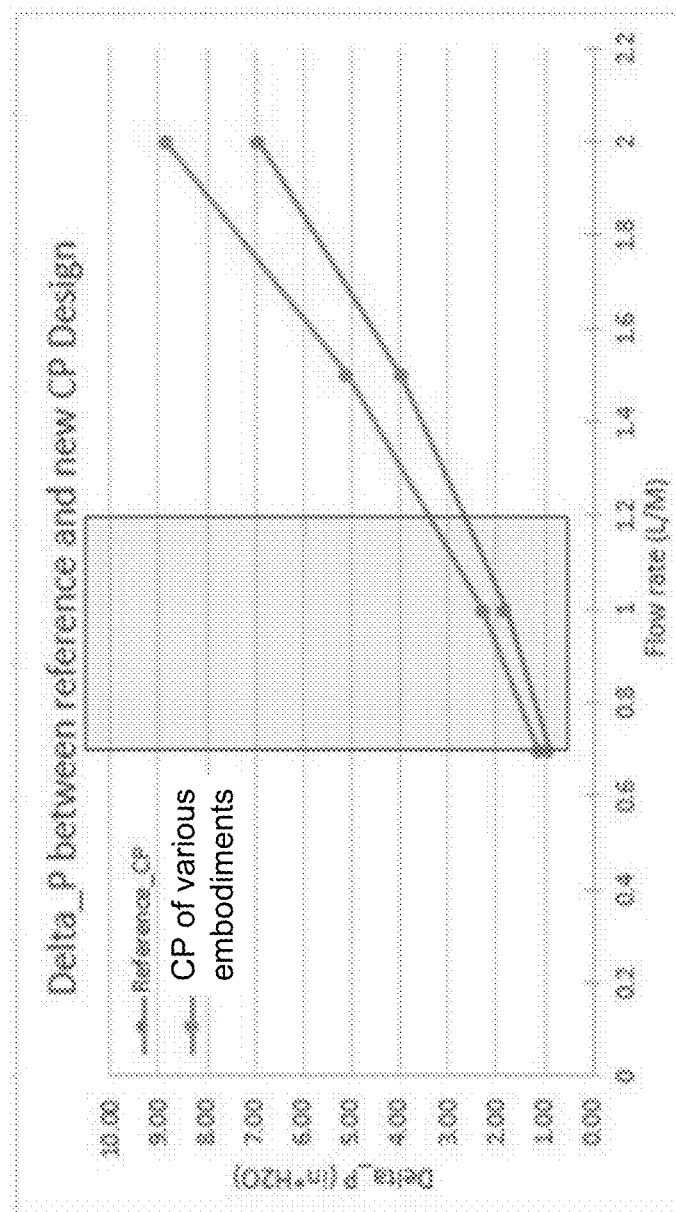
FIG. 11 shows a comparison of pressure drop between various cold plate designs.

FIG. 11 shows a comparison of pressure drop 'delta_P' between the reference CP and CP of various embodiments using 2*XCC MCP package. In the range of interest [0.7 1.2] l/m for the liquid flow rate, the pressure drop of CP of various embodiments is a little higher than that of reference CP, mainly driven by the manifold. The design of this manifold for CP of various embodiments has not been optimized and this pressure drop due to the manifold can be reduced by optimizing or reducing turns for liquid in the manifold. Various embodiments of design, material and manufacturing process are described next.

Figure 12:
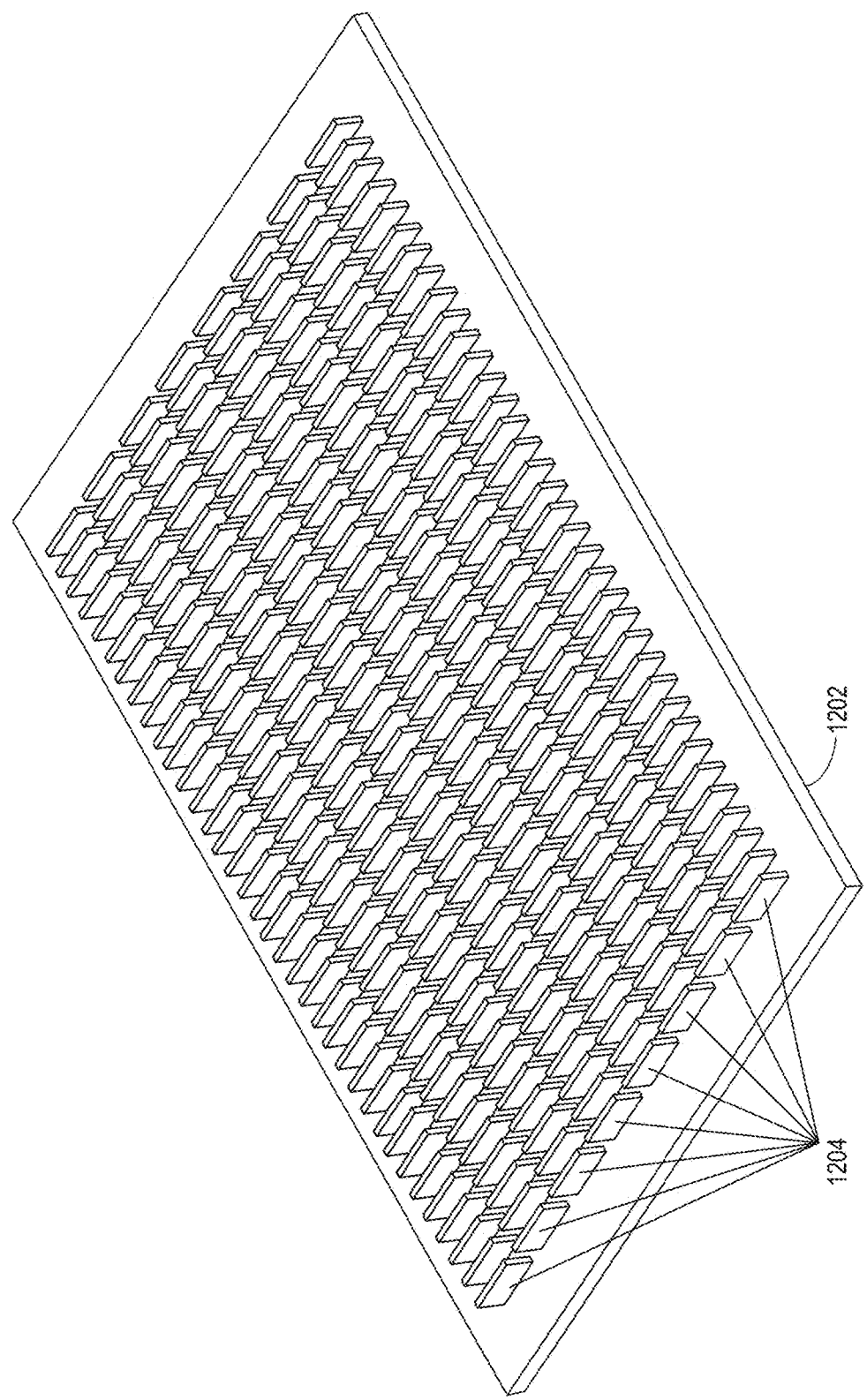
FIG. 12 shows an example base fin block.

FIG. 12 shows an example base fin block. An example base fin block 1202 has fin bank 1204 with fins perpendicular to a floor plan or die placement. Base bin block 1202 can be made of copper using a copper skiving process. For example, (1) a copper base can be pre-cut to form separation between future fins through a skiving process (e.g., material removal) and (2) skiving to form fins. Base 1202 and fins 1204 can be formed of copper or stainless steel. Some fins 1204 can include an inner graphite material.

Figure 13:
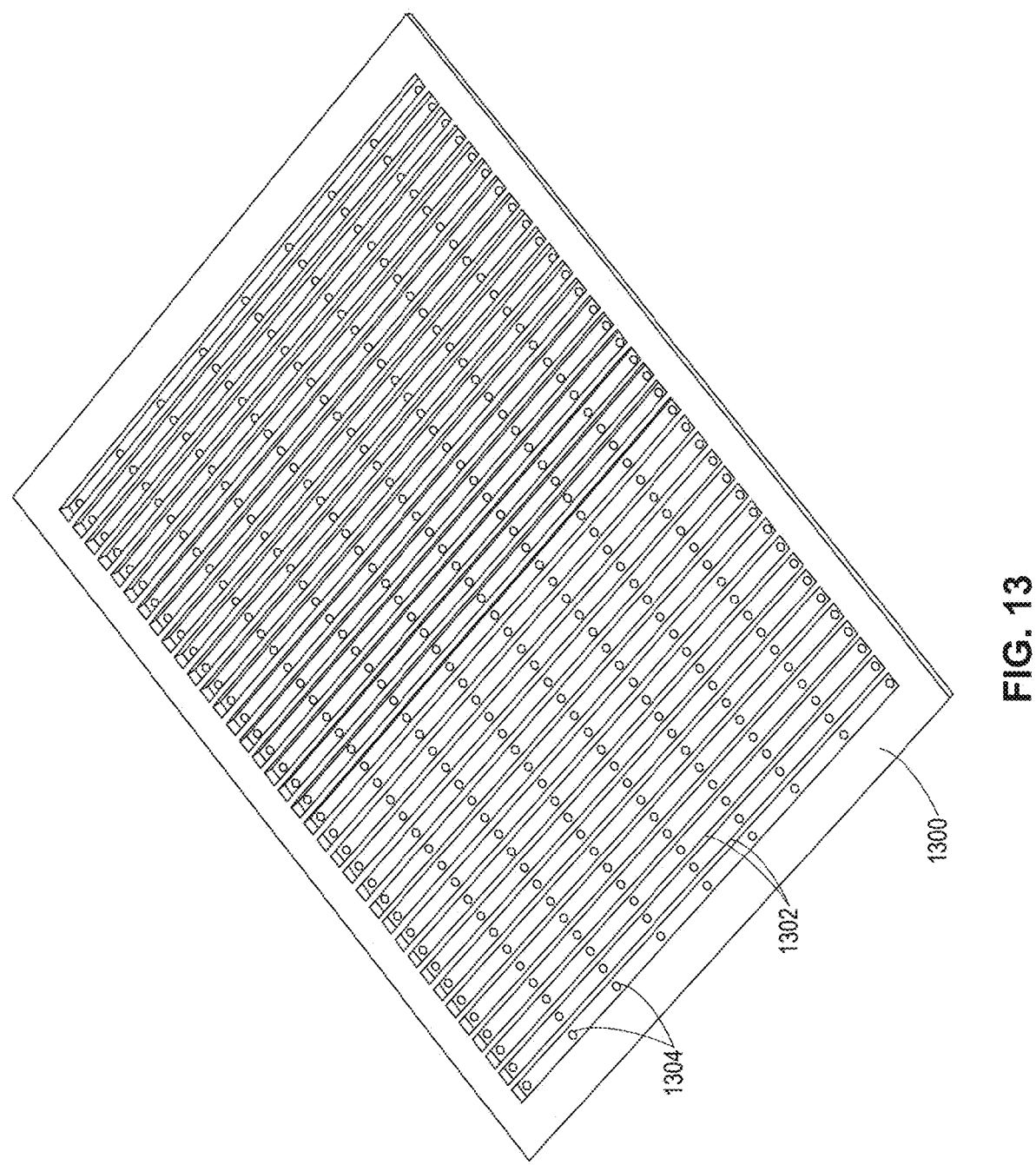
FIG. 13 depicts an example middle layer with walls to separate and guide liquid flow.

FIG. 13 depicts an example middle layer. Walls 1302 can be formed in middle layer to separate and guide liquid flow. Holes 1304 can provide channels for fresh and heated liquid. Walls 1302 or separators can be parallel to contain liquid from inlet holes 1304 to flow across fins within a row. The middle layer with holes 1304 can be a separate single piece instead of integrated with base fin block or integrated with the manifold. By doing it, more options and flexibility to its manufacturing and material selection can be offered. Middle layer can be formed using an injection molding process with enough accuracy. Various embodiments of middle layer 130 can be formed of copper or stainless steel or other metals.

Figure 14:
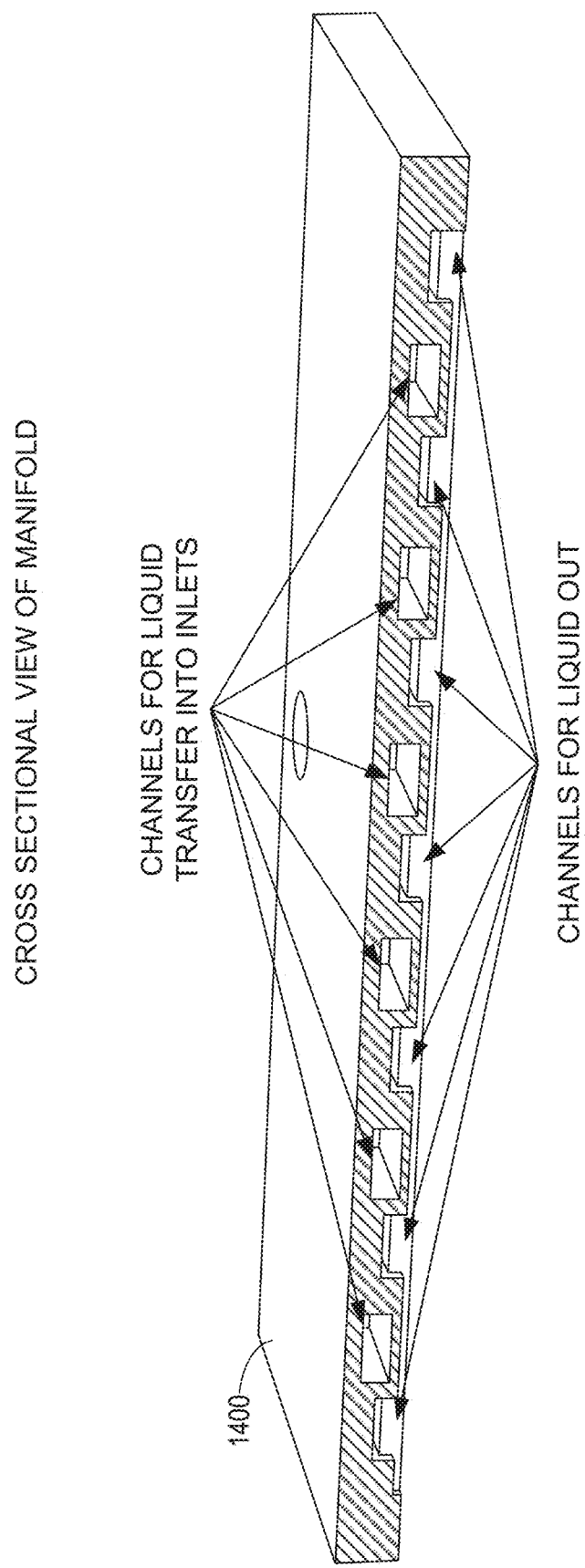
FIG. 14 depicts a cross-section view of the manifold.

FIG. 14 depicts a cross-section view of an example manifold. Manifold 1400 can be divided into two separate layers (with corresponding channels) to isolate liquid out of the manifold (e.g., heated liquid) from liquid provided to the manifold (e.g., unheated liquid). Manifold 1400 can be made out of copper or stainless steel. A brazing process can be used to bond two layers together to form one single piece of manifold 1400.

Figure 15:
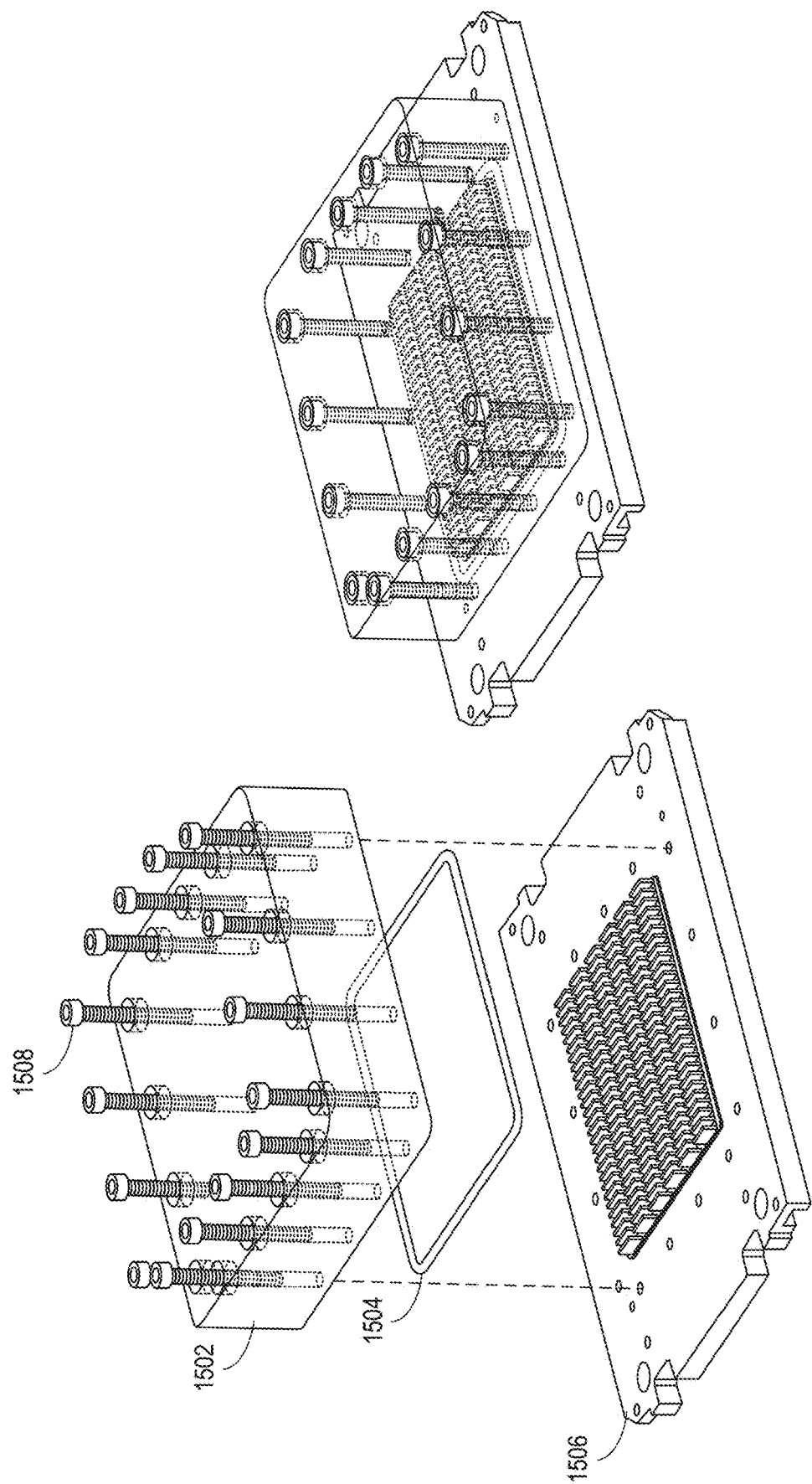
FIG. 15 shows an example assembly of manifold with middle layer and a base fin block.

FIG. 15 shows an example assembly of manifold with middle layer 1502, sealant "0-ring" 1504 and base fin block 1506 using screws 1508.

FIG. 16 depicts perspectives of a base fin block with protruding fins 1602.

Figure 17:
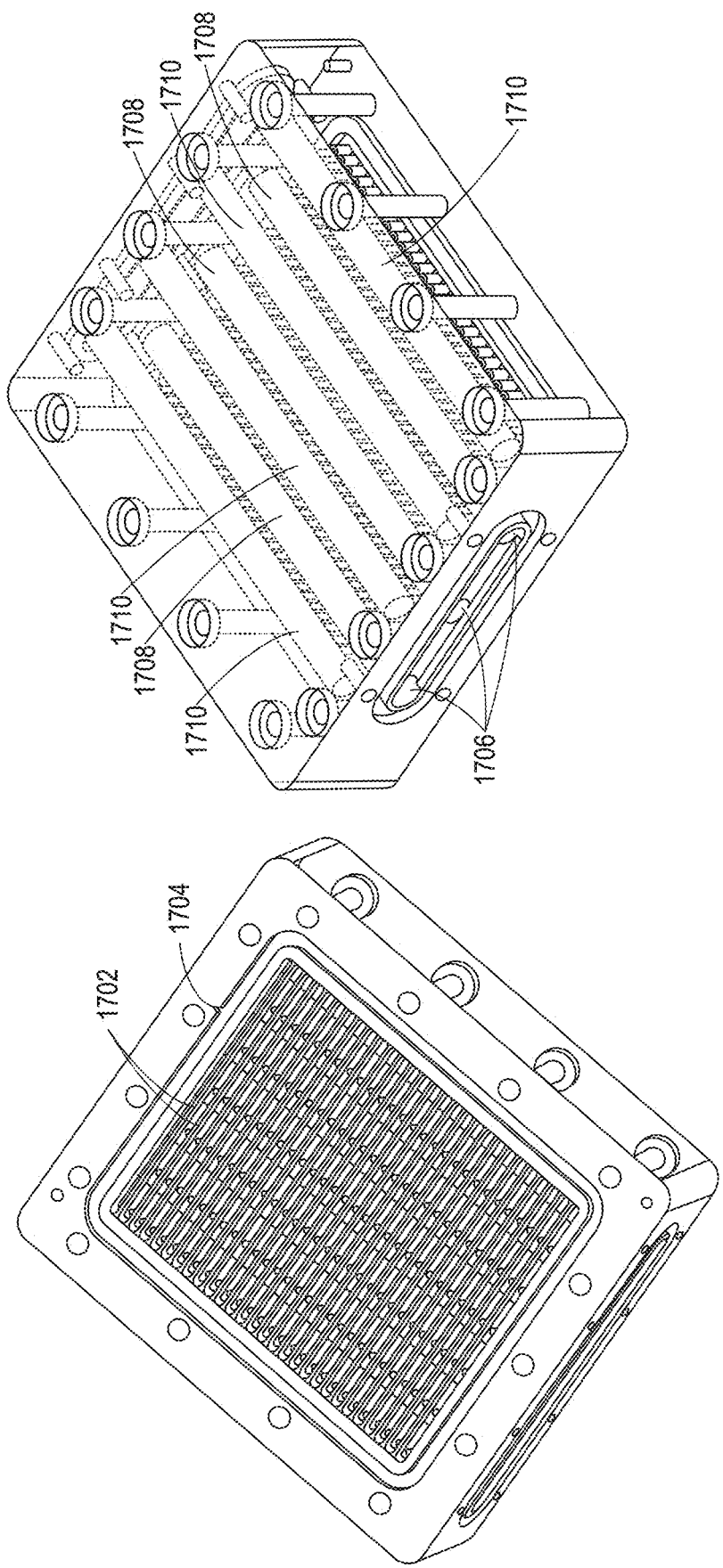
FIG. 17 depicts perspectives of a manifold with middle layer.

FIG. 17 depicts perspectives of a manifold with middle layer. In this example, inlet 1706 are on a side of a manifold but inlets can be on any exposed surface (e.g., top or other side) of a manifold. In this example, outlets (not shown) are on an opposite side of the inlets but outlets can be on any exposed surface (e.g., top or other side). Separators 1702 in a middle layer can be used to decouple and separate different rows of incoming fresh liquid from heated liquid or liquid that has traversed fins. Fresh liquid from one or more inlets 1706 can be provided through inlet channels 1708 and liquid that has traversed fins can be provided through outlet channels 1710 to one or more outlets.

Figure 18A:
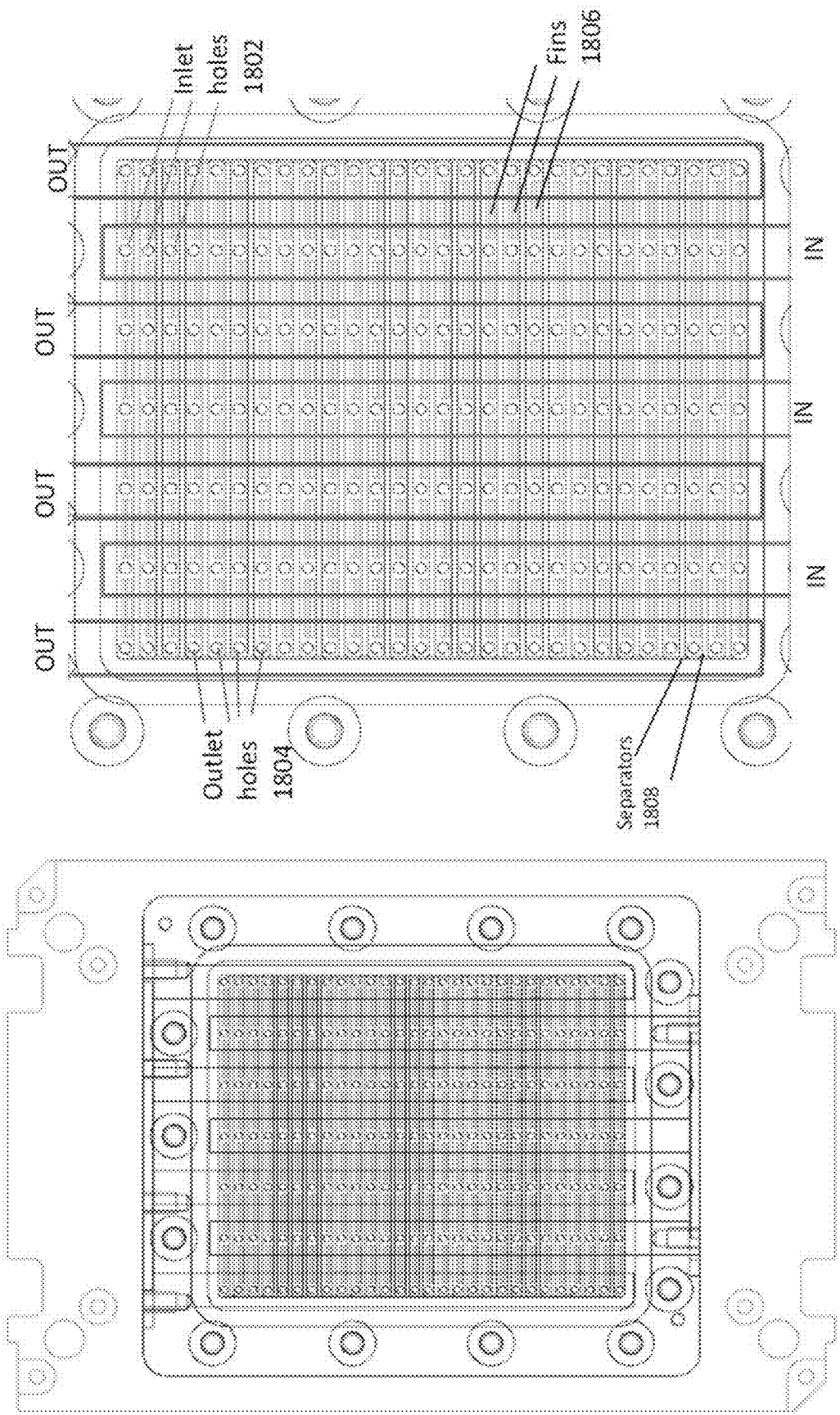
FIG. 18A depicts a top-down perspective of a manifold and middle layer.

FIG. 18A depicts a top-down perspective of a manifold and middle layer. In this example, fluid inlets (IN) are on a side and fluid outlets (OUT) are on an opposite side. However, the inlets can be placed on any side. In some examples, a single inlet can be used to provide fluid to the inlets. In some examples, a single outlet can be used to receive fluid from the outlets. An inlet (IN) can provide fluid to multiple inlet holes 1802 that channel liquid towards the fins 1806 to contact an end of a fin and traverse opposite surfaces of the fin. Outlet holes 1804 can receive fluid that traversed across surfaces of the fin and provide the fluid (e.g. heated fluid) to an outlet (OUT). A coolant distributor unit (CDU) (not shown) inside a data center or edge network can pump or force liquid to fluid INLETS of different server CPUs.

Figure 18B:
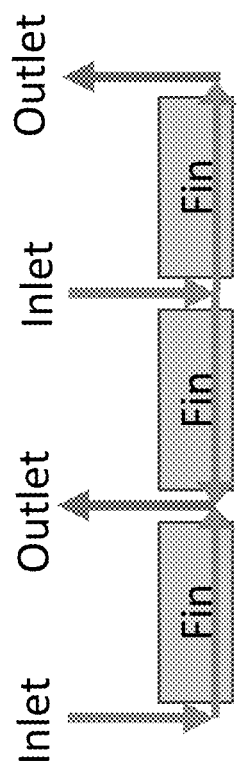
FIG. 18B depicts an example flow of liquid from an inlet.

FIG. 18B depicts an example flow of liquid from an inlet. A fin can absorb heat from a device that is positioned proximate to the fin and near the cold plate. In this example, liquid from an inlet flows towards through an inlet hole towards fins and across a pair of fins (green arrow and line) and liquid (e.g. heated liquid) exits through an outlet hole positioned proximate to an opposite end of the fin (red arrow). Inlet holes can provide liquid to flow across multiple fins in the opposite direction. Outlet holes (channels) can receive liquid that flows across multiple fins.

FIG. 19 depicts an example cross section showing a delivery of fluid from the inlet channel towards an end of a fin or fins. Fluid can flow into inlet channel 1902 through inlet holes 1904 or inlet guides towards across fins 1906. Separators 1908 can separate inlet liquid provided over a fin from inlet liquid provided over another fin or from liquid to be provided to an outlet.

Figure 20:
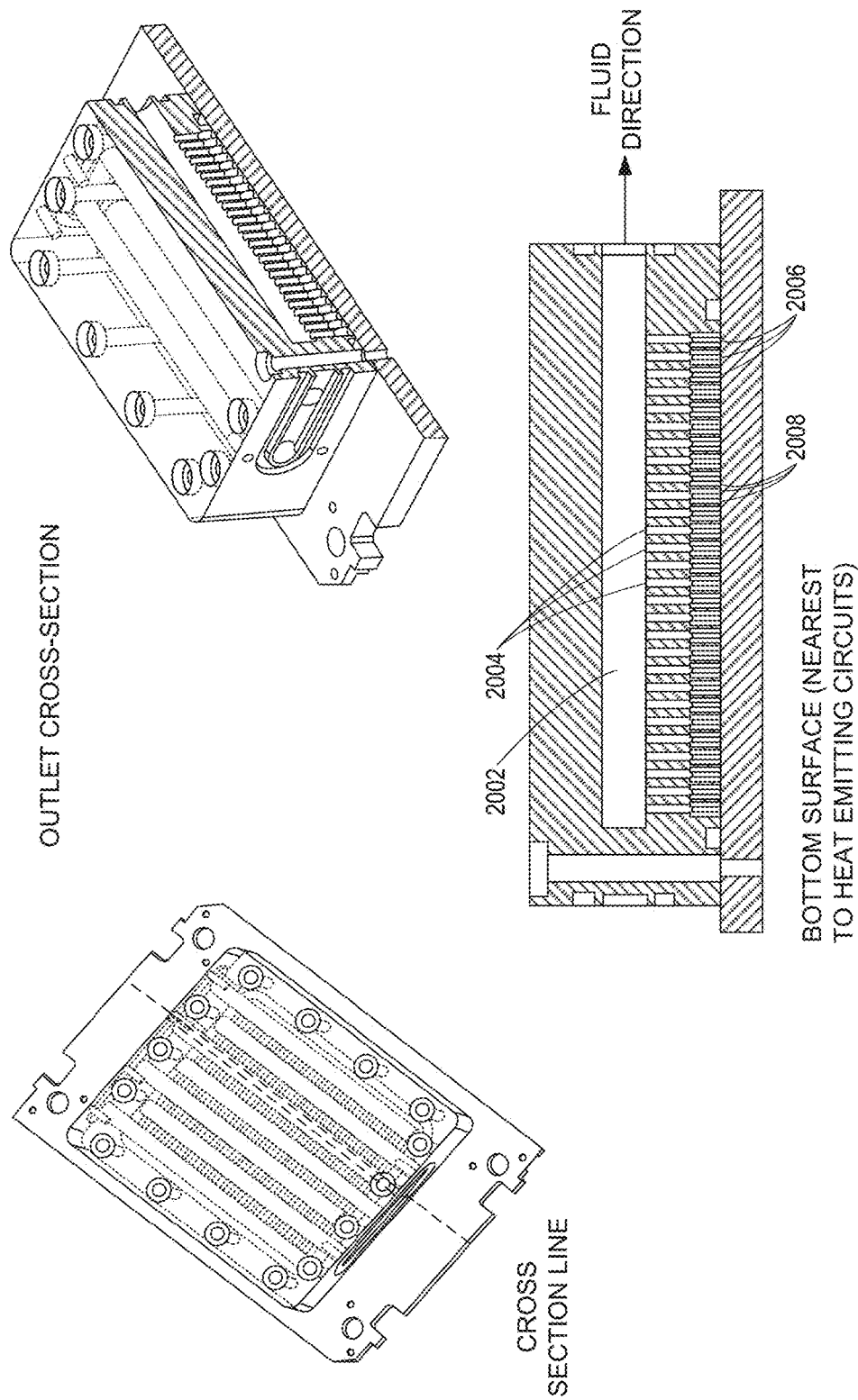
FIG. 20 depicts an example cross section showing a receipt of fluid.

FIG. 20 depicts an example cross section showing a receipt of fluid from an opposite end of a fin 1906 (e.g., opposite from the end of the fin that receives the inlet fluid). Fluid can flow up through outlet holes 2004 or outlet guides towards outlet channel 2002 away from fins 1906 and out of outlet channel 2002.

Figure 21:
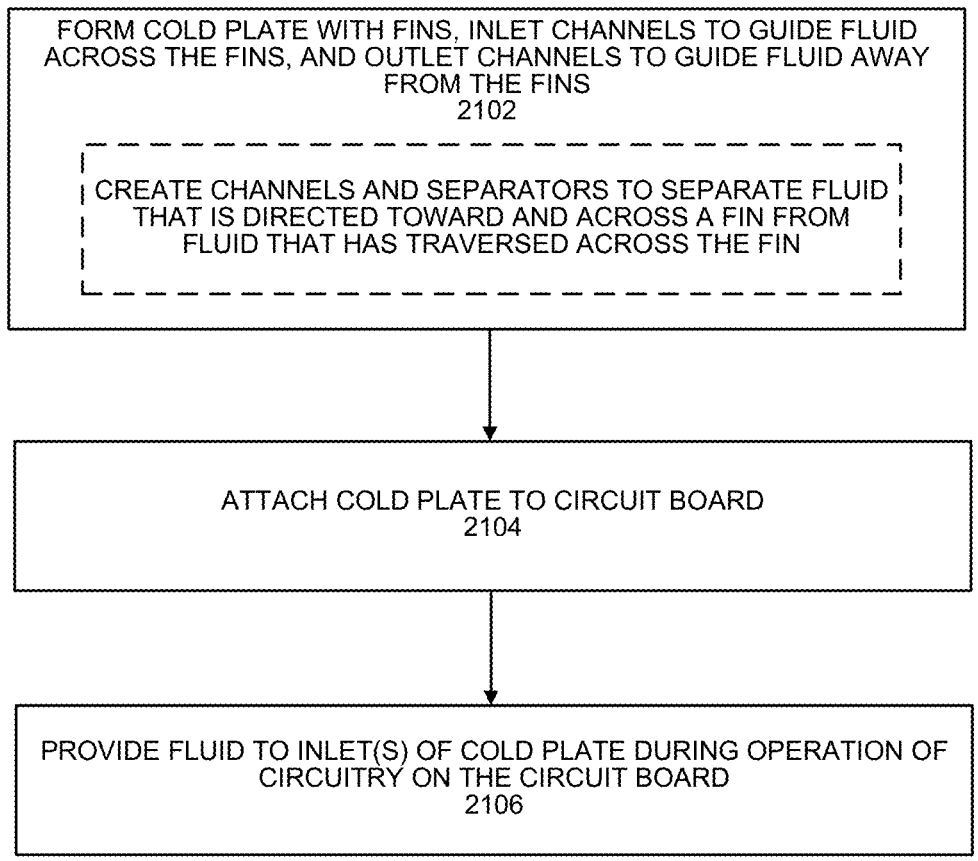
FIG. 21 depicts an example process.

FIG. 21 depicts an example process. At 2102, a cold plate can be formed with fins, inlet channels to guide fluid across the fins, and outlet channels to fluid away from the fins. In some examples, channels can be created in the cold plate that separate fluid that is directed towards a fin from fluid directed away from the fin. In some examples, channels can separate fluid provided towards one or more fins from fluid provided towards one or more other fins.

At 2104, the cold plate can be attached to a circuit board proximate one or more attached devices. In some examples, the circuit board can have one or more attached device, where an attached device includes one or more of a CPU, GPU, accelerator, memory, storage, or other circuitry that generates heat when operational.

At 2106, fluid can be provided to the cold plate during operation of the attached device(s). Fluid can be directed down towards a fin and in a direction of an attached device, across the fin, and away from the fin and away from the attached device.

Microchannel Active Cooled Backplate

There is a current trend to standardize to low temperature solder, for warpage reduction, higher surface mount technology (SMT) yield, cost reduction and energy savings. This warrants keeping the operating temperature of solder balls lower than 80 degrees Celsius. A high TDP with low temperature solder can exceed the transition temperature for solder balls (and liquify solder balls between the printed circuit board (PCB) and CPU package) which can cause device malfunction. Full or partial melting of solder balls can lead to electrical connection failure and device malfunction. Some solutions include flattened heat pipes and passive cold plates to maintain or reduce a temperature of solder balls. However, heat pipes may deform or corrode and fail. A minimum clearance may be needed, which places a height limitation on the heat pipe and limits an ability of the heat pipe to reduce the temperature of solder balls. Some solutions reduce or limit operation or capability of a heat emitting device to lower heat emission to attempt to avoid causing solder balls to reach the transition temperature.

Various embodiments provide a heat spreader with a microchannel plate with fluid channels routed in a conductive layer (e.g., copper or other high stiffness conductive heat spreader material), where the top conductive layer is bonded to a bottom structural layer (e.g., steel), with an intervening high-pressure gasket (e.g., expanded Polytetrafluoroethylene (PTFE) or Teflon®). Various embodiments can provide local cooling to a solder ball field, and other board components. Various embodiments can also provide a backplate that provides structural integrity in a potentially compact assembly. Various embodiments can permit use of high TDP packages by providing dual plane cooling. Various embodiments potentially provide a compact footprint, with micro channels in the bulk of the conductive layer to compensate for differences in thermal expansion between metal layers.

Figure 22A:
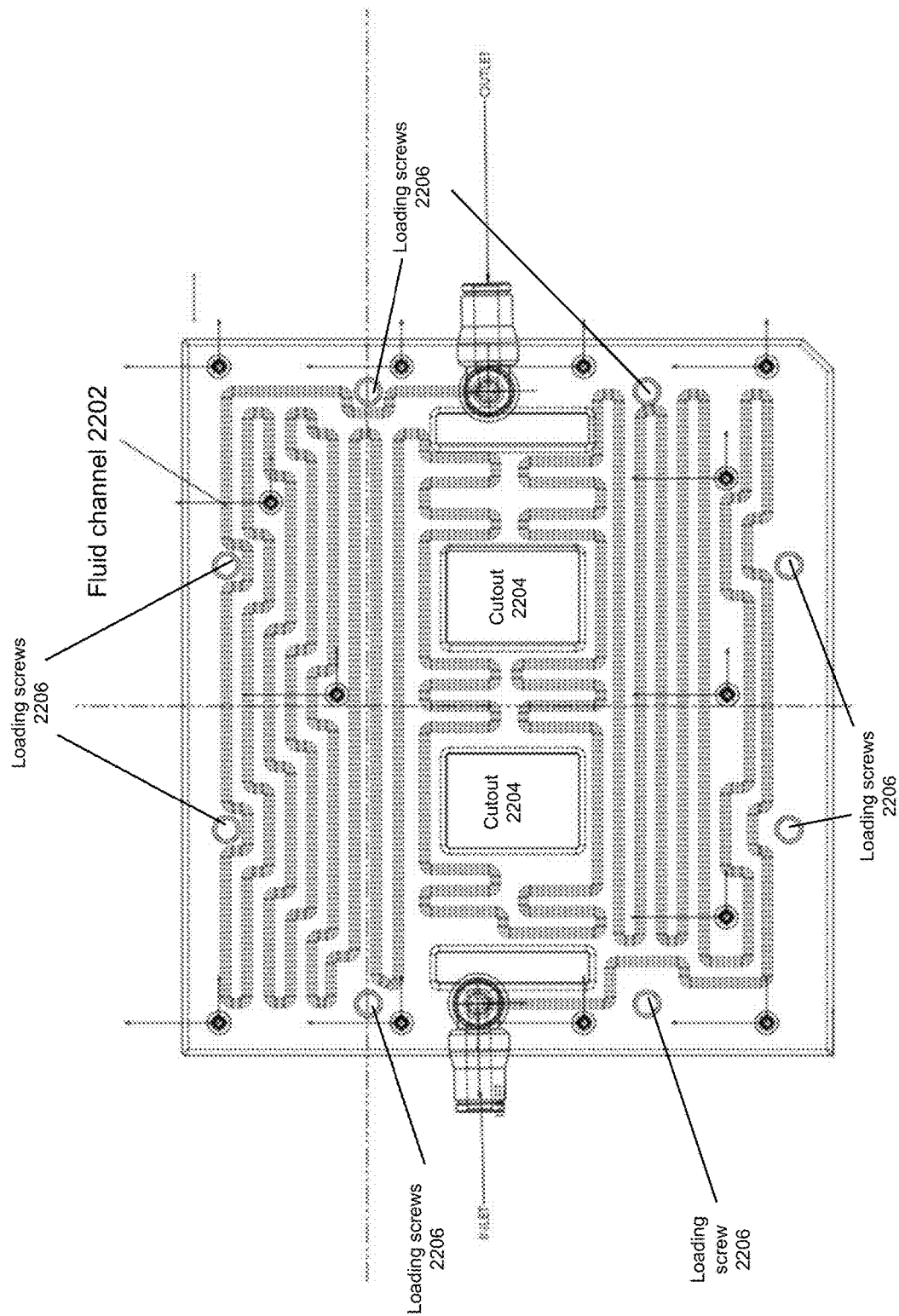
FIG. 22A depicts a transparent view of a bottom plate with channels.

FIG. 22A depicts a transparent view of a bottom plate with channels. Channels 2202 can carry fluid from an inlet to an outlet. Cutouts 2204 can be positioned so that circuitry can be positioned under the bottom plate. In some examples, fluid channels 2202 envelope or surround cutouts 2204. Loading screws 2206 can be used to mount the bottom plate to a circuit board (e.g., PCB).

Figure 22B:
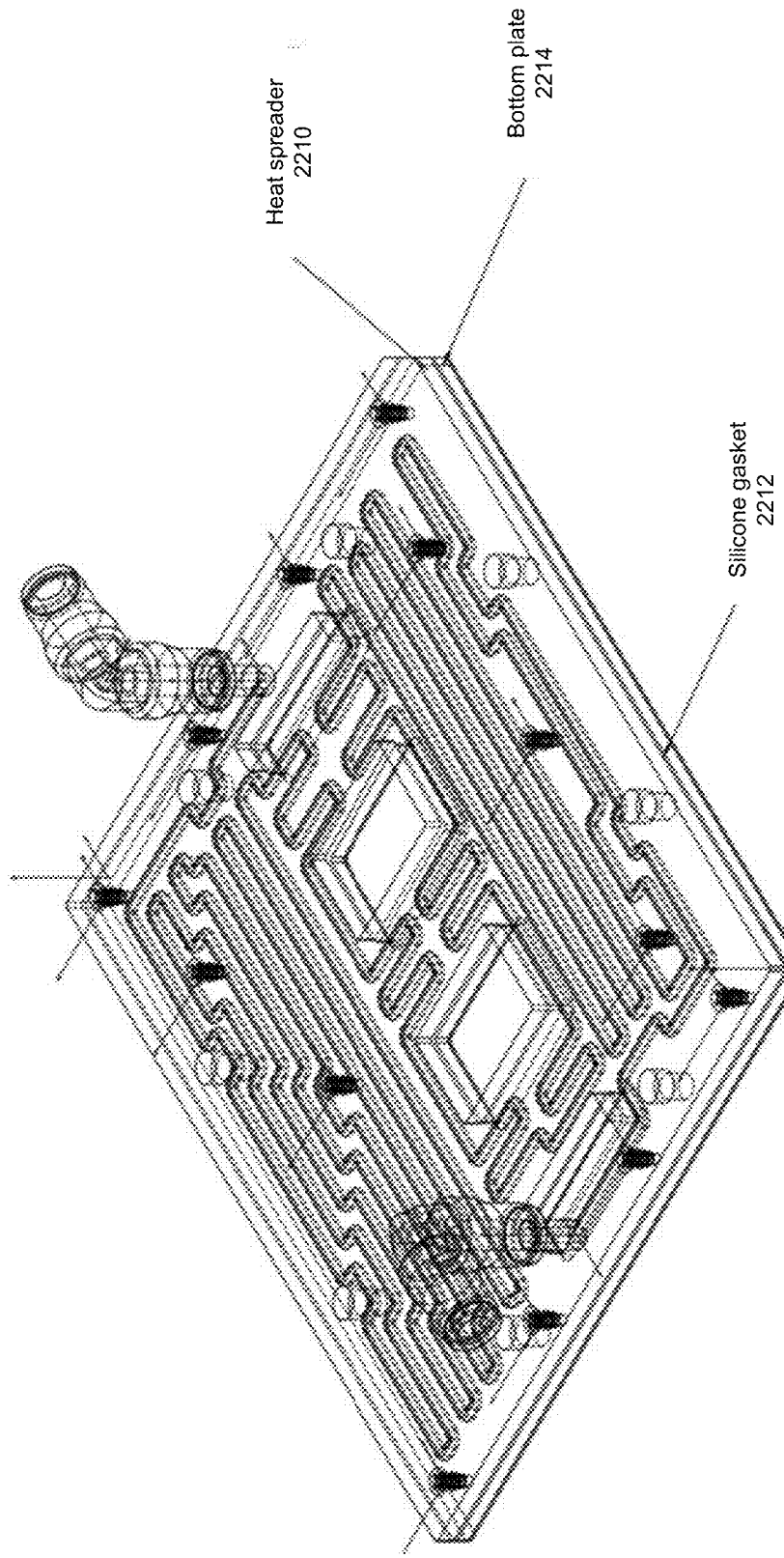
FIG. 22B depicts another view of a bottom plate with channels.

FIG. 22B depicts another view of a bottom plate with channels. In this example, the bottom plate of FIG. 22A can correspond to heat spreader 2210. Heat spreader 2210 can be formed of copper material or other thermally conductive materials. Heat spreader 2210 can include microchannel patterns that surround a particular component or base of a ball grid array (BGA) or device to be cooled. In some examples, microchannels can be engraved into heat spreader 2210. A gasket 2212 (e.g., silicone or an insulator) can form a seal between bottom plate 2214 and heat spreader 2210. Gasket 2212 can attempt to prevent a galvanic reaction (e.g., dissimilar materials in contact with liquid creating a battery or accelerated rusting). Bottom plate 2214 can be formed of steel, stainless steel or other thermally conductive material. Bottom plate 2214 can provide structural rigidity to attempt to reduce or limit deformation or warpage of a circuit board which can cause solder joint failure due to circuit board warpage. Use of heat spreader 2210 and bottom plate 2214 can provide a more compact design than use of a heat pipe.

Figure 23A:
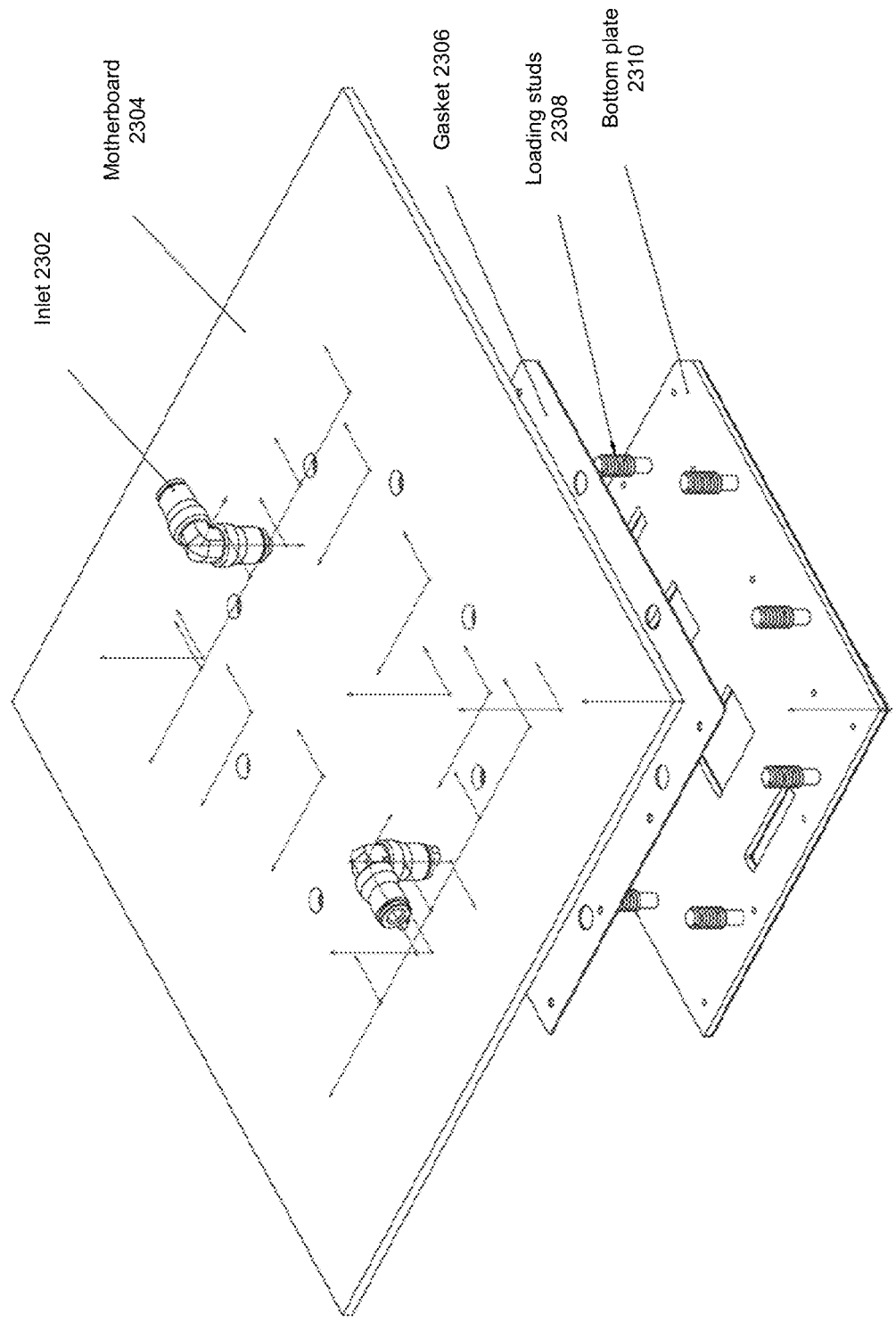
FIGS. 23A and 23B depict examples of deconstructed heat spreader system.
Figure 23B:
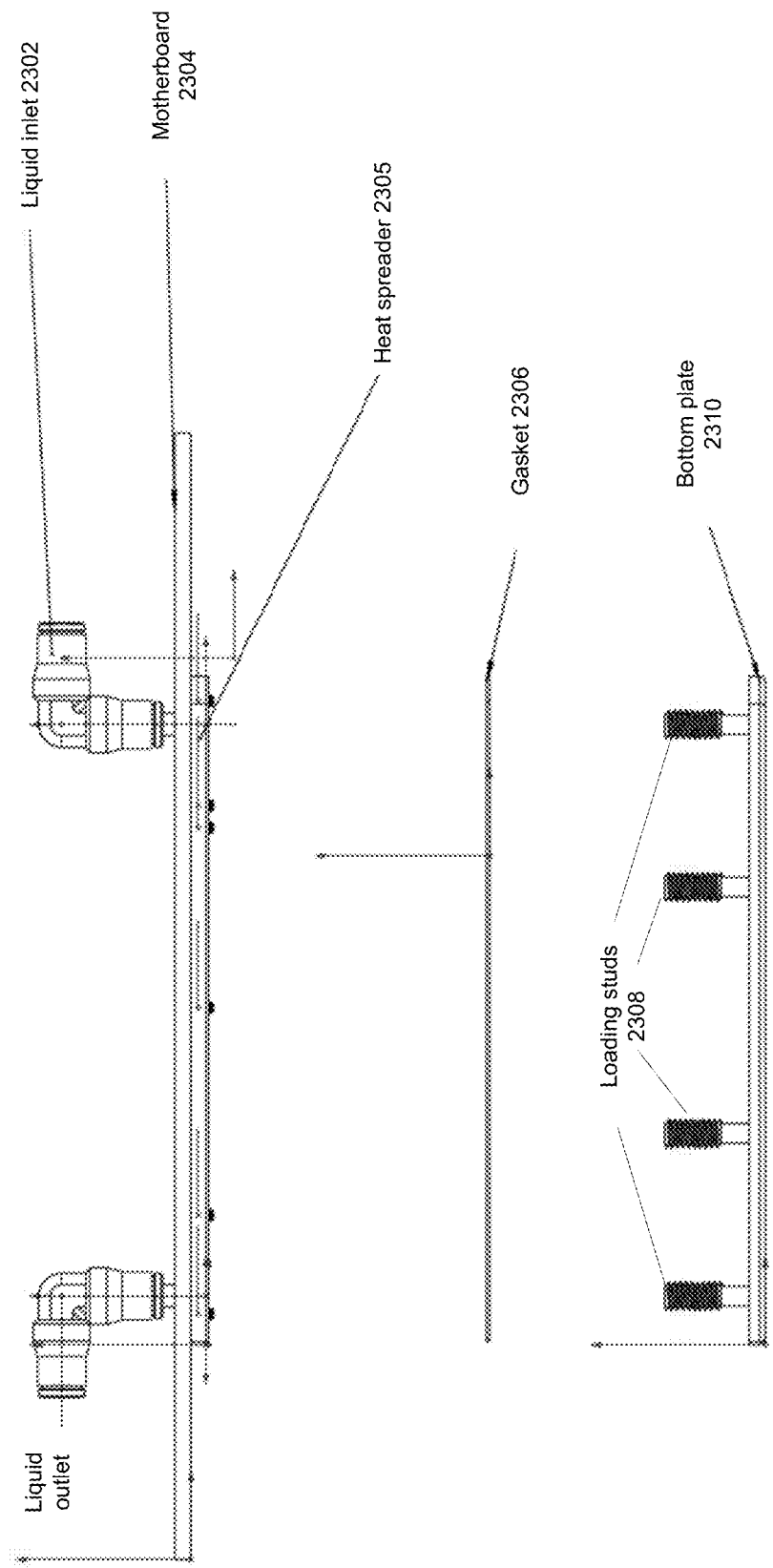

FIGS. 23A and 23B depict examples of deconstructed heat spreader system. Motherboard 2304 can be provided over a heat spreader 2305. Liquid inlet 2302 can protrude through motherboard 2304 to receive liquid (or gas) and guide the liquid to channels of heat spreader 2305. Gasket 2306 can form a sealant between heat spreader 2305 and bottom plate 2310. Loading studs 2308 can be used to affix bottom plate 2310 to heat spreader 2305 and motherboard 2304.

Figure 24:
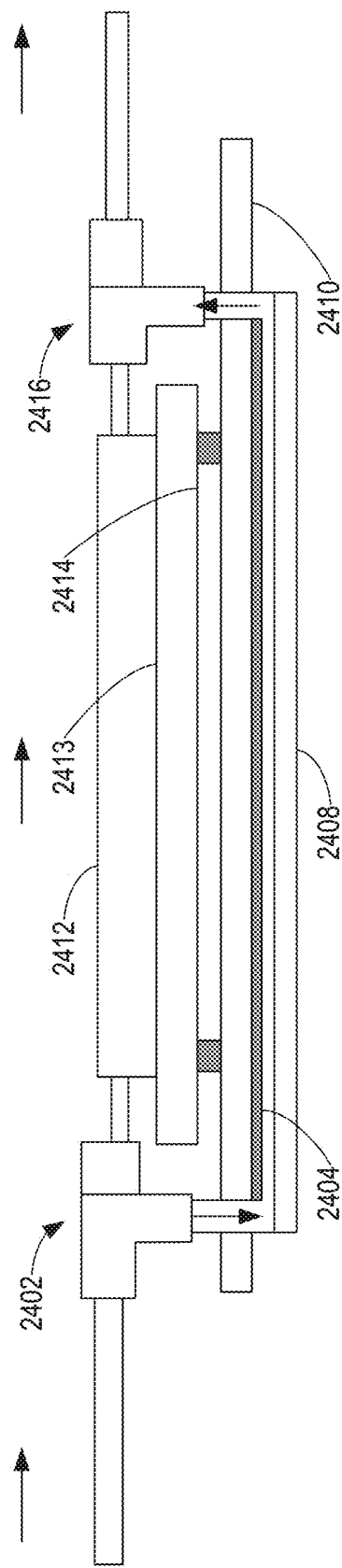
FIG. 24 depicts an example of a stack up configuration showing tie-in of bottom cold plate with fluidics manifold.

FIG. 24 depicts an example of a stack up configuration showing tie-in of bottom cold plate with fluidics manifold. Some examples provide a dual sided cooling system where heat generated from CPU 2414 can be diverted away from CPU 2414 through top cold plate 2412 and heat spreader 2404. Fluid can flow through inlet 2402 to main cold plate 2412 and heat spreader 2404. Top cold plate 2412 can be made from brazed copper or other heat conductive or absorbing material in some examples. A pedestal 2413 beneath cold plate 2412 can be mounted to CPU 2414 (or other device or circuitry) with screws. Pedestal 2413 can be formed from a thermally conductive or absorbing material and can be semi-hollow or solid.

Relative flow rate through top cold plate 2412 and heat spreader 2404 can be controlled by a cross sectional area ratio between an inlet to top cold plate 2412 and an inlet to heat spreader 2404. Back pressure to inlet 2402 can be controlled by changing width and depth of microchannels in heat spreader 2404.

Figure 25:
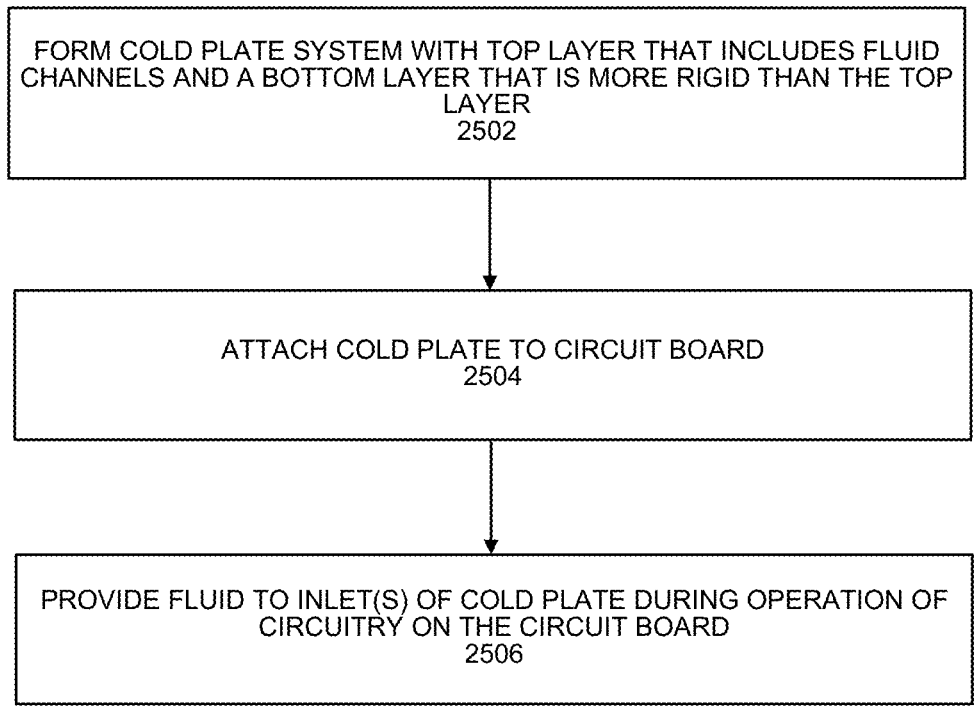
FIG. 25 depicts an example process.

FIG. 25 depicts an example process. At 2502, a cold plate system can be formed with channels that are positioned to surround heat emitting circuitry. The cold plate system can include a bottom layer that is more rigid than a top layer with channels that guide liquid from an inlet. A gasket can be used to separate the bottom layer from the top layer to prevent corrosion of the bottom layer. At 2504, the cold plate system can be mounted or attached to a motherboard connected to one or more circuitry devices. The channels can surround the devices to absorb heat emitted from the devices into fluids or gases and away from the devices. At 2506, fluid or gas can be provided to one or more inlets that direct fluid to channels in the top layer. Fluid or gas can be directed down towards heat emitting device to absorb heat and direct heat away from the device to potentially reduce temperature of the device and potentially avoid melting of a solder ball.

Figure 26:
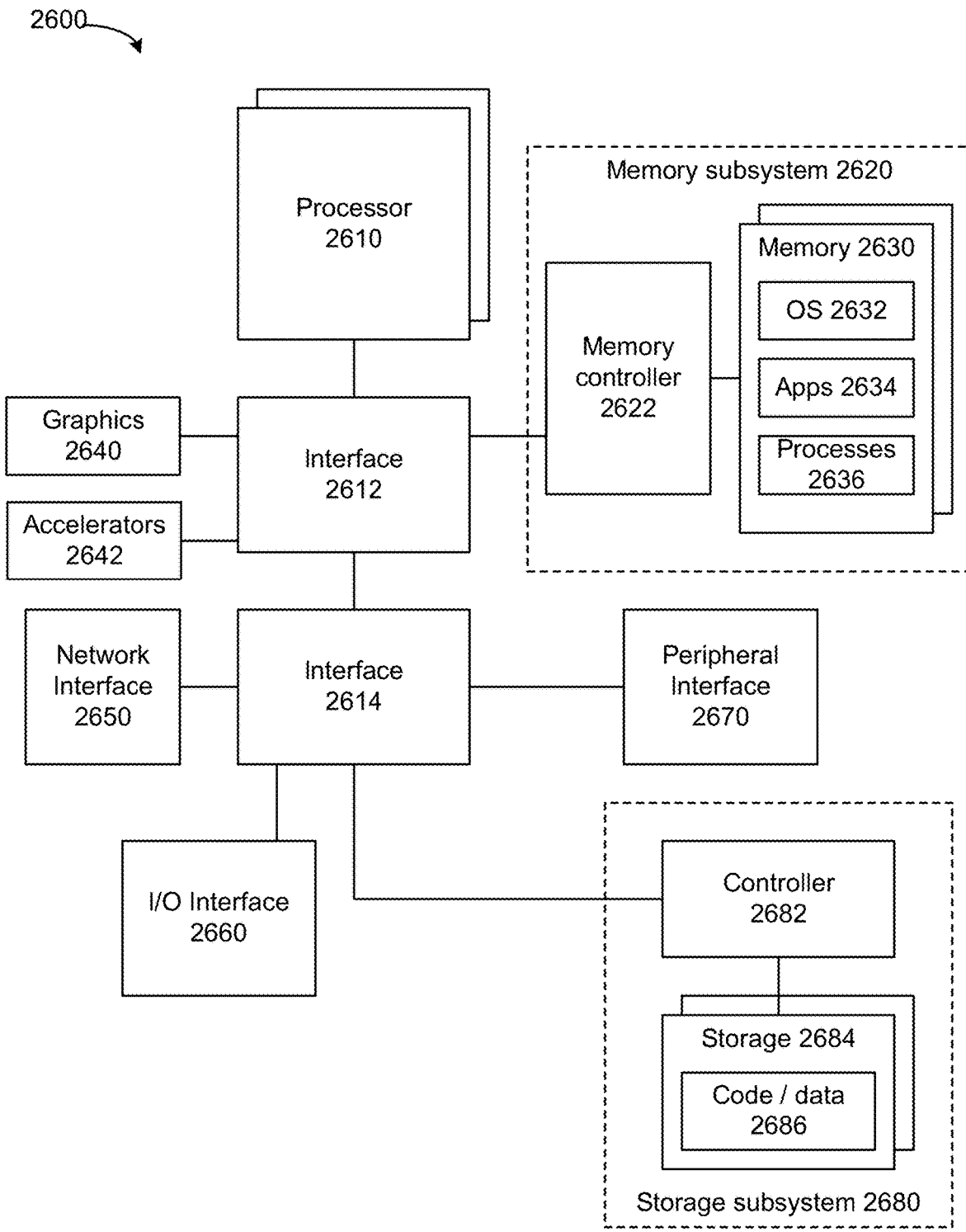
FIG. 26 depicts a system.
Figure 27:
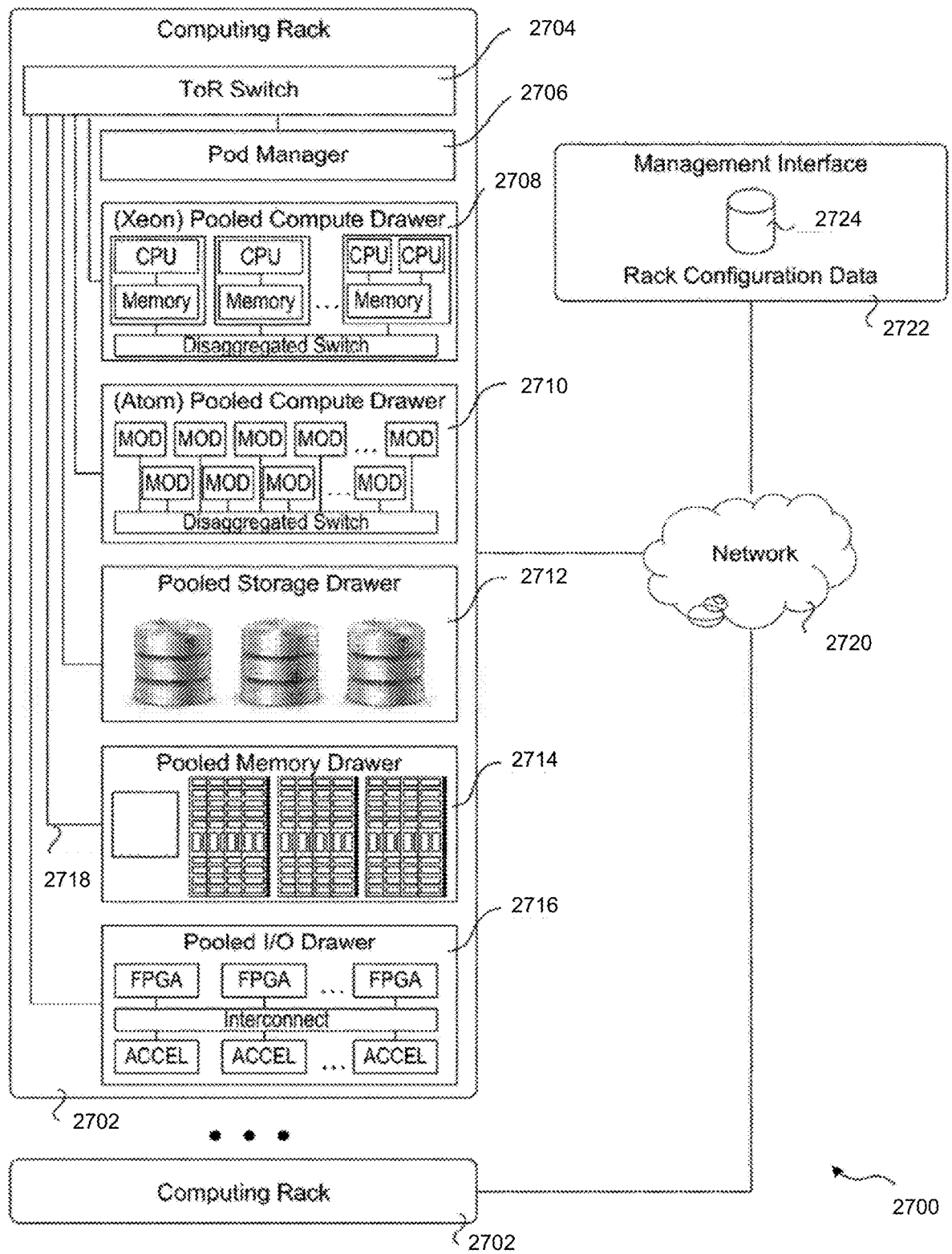
FIG. 27 depicts an example environment.

FIG. 26 depicts a system. Various embodiments of system 2600 can use any cold plate described herein to direct heat away from a device. System 2600 includes processor 2610, which provides processing, operation management, and execution of instructions for system 2600. Processor 2610 can include any type of microprocessor, central processing unit (CPU), graphics processing unit (GPU), processing core, or other processing hardware to provide processing for system 2600, or a combination of processors. Processor 2610 controls the overall operation of system 2600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 2600 includes interface 2612 coupled to processor 2610, which can represent a higher speed interface or a high throughput interface for system components that needs higher bandwidth connections, such as memory subsystem 2620 or graphics interface components 2640, or accelerators 2642. Interface 2612 represents an interface circuit, which can be a standalone component or integrated onto a processor die. Where present, graphics interface 2640 interfaces to graphics components for providing a visual display to a user of system 2600. In one example, graphics interface 2640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 2640 generates a display based on data stored in memory 2630 or based on operations executed by processor 2610 or both. In one example, graphics interface 2640 generates a display based on data stored in memory 2630 or based on operations executed by processor 2610 or both.

Accelerators 2642 can be a fixed function or programmable offload engine that can be accessed or used by a processor 2610. For example, an accelerator among accelerators 2642 can provide compression (DC) capability, cryptography services such as public key encryption (PKE), cipher, hash/authentication capabilities, decryption, or other capabilities or services. In some embodiments, in addition or alternatively, an accelerator among accelerators 2642 provides field select controller capabilities as described herein. In some cases, accelerators 2642 can be integrated into a CPU socket (e.g., a connector to a motherboard or circuit board that includes a CPU and provides an electrical interface with the CPU). For example, accelerators 2642 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs) or programmable logic devices (PLDs). Accelerators 2642 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 2620 represents the main memory of system 2600 and provides storage for code to be executed by processor 2610, or data values to be used in executing a routine. Memory subsystem 2620 can include one or more memory devices 2630 such as read-only memory (ROM), flash memory, one or more varieties of random-access memory (RAM) such as DRAM, or other memory devices, or a combination of such devices. Memory 2630 stores and hosts, among other things, operating system (OS) 2632 to provide a software platform for execution of instructions in system 2600. Additionally, applications 2634 can execute on the software platform of OS 2632 from memory 2630. Applications 2634 represent programs that have their own operational logic to perform execution of one or more functions. Processes 2636 represent agents or routines that provide auxiliary functions to OS 2632 or one or more applications 2634 or a combination. OS 2632, applications 2634, and processes 2636 provide software logic to provide functions for system 2600. In one example, memory subsystem 2620 includes memory controller 2622, which is a memory controller to generate and issue commands to memory 2630. It will be understood that memory controller 2622 could be a physical part of processor 2610 or a physical part of interface 2612. For example, memory controller 2622 can be an integrated memory controller, integrated onto a circuit with processor 2610.

While not specifically illustrated, it will be understood that system 2600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 2600 includes interface 2614, which can be coupled to interface 2612. In one example, interface 2614 represents an interface circuit, which can include standalone components and integrated circuitry. In one example, multiple user interface components or peripheral components, or both, couple to interface 2614. Network interface 2650 provides system 2600 the ability to communicate with remote devices (e.g., servers or other computing devices) over one or more networks. Network interface 2650 can include an Ethernet adapter, wireless interconnection components, cellular network interconnection components, USB (universal serial bus), or other wired or wireless standards-based or proprietary interfaces. Network interface 2650 can transmit data to a device that is in the same data center or rack or a remote device, which can include sending data stored in memory. Network interface 2650 can receive data from a remote device, which can include storing received data into memory. Various embodiments can be used in connection with network interface 2650, processor 2610, and memory subsystem 2620.

Some examples of network interface 2650 are part of an Infrastructure Processing Unit (IPU) or data processing unit (DPU). An IPU or DPU can include a network interface with one or more programmable or fixed function processors to perform offload of operations that could have been performed by a CPU. The IPU or DPU can include one or more memory devices. In some examples, the IPU or DPU can perform virtual switch operations, manage storage transactions (e.g., compression, cryptography, virtualization), and manage operations performed on other IPUs, DPUs, servers, or devices. An xPU can refer at least to one or more of: IPU, DPU, GPU, GPGPU, or other processing units (e.g., accelerator device).

In one example, system 2600 includes one or more input/output (I/O) interface(s) 2660. I/O interface 2660 can include one or more interface components through which a user interacts with system 2600 (e.g., audio, alphanumeric, tactile/touch, or other interfacing). Peripheral interface 2670 can include any hardware interface not specifically mentioned above. Peripherals refer generally to devices that connect dependently to system 2600. A dependent connection is one where system 2600 provides the software platform or hardware platform or both on which operation executes, and with which a user interacts.

In one example, system 2600 includes storage subsystem 2680 to store data in a nonvolatile manner. In one example, in certain system implementations, at least certain components of storage 2680 can overlap with components of memory subsystem 2620. Storage subsystem 2680 includes storage device(s) 2684, which can be or include any conventional medium for storing large amounts of data in a nonvolatile manner, such as one or more magnetic, solid state, or optical based disks, or a combination. Storage 2684 holds code or instructions and data 2686 in a persistent state (i.e., the value is retained despite interruption of power to system 2600). Storage 2684 can be generically considered to be a "memory," although memory 2630 is typically the executing or operating memory to provide instructions to processor 2610. Whereas storage 2684 is nonvolatile, memory 2630 can include volatile memory (i.e., the value or state of the data is indeterminate if power is interrupted to system 2600). In one example, storage subsystem 2680 includes controller 2682 to interface with storage 2684. In one example controller 2682 is a physical part of interface 2614 or processor 2610 or can include circuits or logic in both processor 2610 and interface 2614.

A volatile memory is memory whose state (and therefore the data stored in it) is indeterminate if power is interrupted to the device. Dynamic volatile memory uses refreshing the data stored in the device to maintain state. One example of dynamic volatile memory incudes DRAM (Dynamic Random-Access Memory), or some variant such as Synchronous DRAM (SDRAM). An example of a volatile memory includes a cache. A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase-Change Memory (PCM) or phase-change_memory with a switch (PCMS), Intel® Optane™ memory, NVM devices that use chalcogenide phase change material (for example, chalcogenide glass), resistive memory including metal oxide base, oxygen vacancy base and Conductive Bridge Random-Access Memory (CB-RAM), nanowire memory, ferroelectric random-access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 2600. More specifically, power source typically interfaces to one or multiple power supplies in system 2600 to provide power to the components of system 2600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 2600 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), Transmission Control Protocol (TCP), User Datagram Protocol (UDP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Infinity Fabric (IF), Cache Coherent Interconnect for Accelerators (CCIX), 3GPP Long Term Evolution (LTE) (4G), 3GPP 5G, and variations thereof. Data can be copied or stored to virtualized storage nodes or accessed using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

FIG. 28 depicts an environment 2800 includes multiple computing racks 2802, each including a Top of Rack (ToR) switch 2804, a pod manager 2806, and a plurality of pooled system drawers. The environment can use any cold plate described herein to direct heat away from a device. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® Xeon® processor pooled computer drawer 2808, and Intel® ATOM™ processor pooled compute drawer 2810, a pooled storage drawer 2812, a pooled memory drawer 2814, and a pooled I/O drawer 2816. Each of the pooled system drawers is connected to ToR switch 2804 via a high-speed link 2818, such as an Ethernet link and/or a Silicon Photonics (SiPh) optical link.

Multiple of the computing racks 2802 may be interconnected via their ToR switches 2804 (e.g., to a pod-level switch or data center switch), as illustrated by connections to a network 2820. In some embodiments, groups of computing racks 2802 are managed as separate pods via pod manager(s) 2806. In one embodiment, a single pod manager is used to manage all of the racks in the pod. Alternatively, distributed pod managers may be used for pod management operations.

Environment 2800 further includes a management interface 2822 that is used to manage various aspects of the environment. This includes managing rack configuration, with corresponding parameters stored as rack configuration data 2824. In an example, environment 2800 can be implemented using interconnected compute sleds of processors, memories, storages, network interfaces, and other components.

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," or "logic." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Illustrative examples of the devices, systems, and methods disclosed herein are provided below. An embodiment of the devices, systems, and methods may include any one or more, and any combination of, the examples described below.

Flow diagrams as illustrated herein provide examples of sequences of various process actions. The flow diagrams can indicate operations to be executed by a software or firmware routine, as well as physical operations. In some embodiments, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, and so forth.

Example 1 includes an apparatus comprising: a cold plate comprising: a surface with fins and at least two channels, wherein a first channel is shaped with a first opening extending towards the surface, a second opening proximate and across a first fin attached to the surface, and a third opening from the surface and extending away from the surface.

Example 2 includes any example, wherein when a fluid is provided to the first opening, the first opening directs the fluid towards the surface, the second opening directs the fluid across the first fin, and the third opening directs the fluid away from the surface.

Example 3 includes any example, wherein the second opening comprises split openings around opposite sides of the first fin.

Example 4 includes any example, and includes an inlet guide connected to the first opening and an outlet guide connected to the third opening.

Example 5 includes any example, wherein the inlet guide is to receive fluid and direct fluid to the first opening and towards the first fin.

Example 6 includes any example, wherein the outlet guide is to receive liquid that traverses the first fin and direct the received liquid away from the surface.

Example 7 includes any example, wherein the first channel is to guide fresh liquid towards the surface and a second channel is to guide heated liquid away from the surface.

Example 8 includes any example, wherein the fins are positioned perpendicular or angled with respect to the surface.

Example 9 includes any example, and includes a circuit board comprising one or more devices and the circuit board is positioned in proximity to the surface, wherein the one or more devices comprise one or more of: a central processing unit (CPU), graphics processing unit (GPU), digital signal processor (DSP), application specific integrated circuits (ASICs), programmable logic device (PLD), or accelerator.

Example 10 includes any example, and includes an apparatus comprising: a cold plate comprising: a top layer with channels that are capable to receive liquid or gas and a layer that is more rigid than the top layer, wherein the layer is mounted to the top layer and separate from the top layer using a gasket to reduce corrosion of the layer.

Example 11 includes any example, wherein the top layer comprises copper and the layer comprises steel.

Example 12 includes any example, wherein the channels of the top layer are shaped to surround one or more devices connected to a circuit board.

Example 13 includes any example, and includes the circuit board and the circuit board comprises the one or more devices, wherein the one or more devices comprise one or more of: a central processing unit (CPU), graphics processing unit (GPU), digital signal processor (DSP), application specific integrated circuits (ASICs), programmable logic device (PLD), xPU, or accelerator.

Example 14 includes any example, and includes a method of forming a cold plate, the method comprising: forming an inlet channel in the cold plate; forming an outlet channel in the cold plate; and forming a surface of the cold plate, the surface including multiple fins and at least one opening proximate to a first fin, wherein the inlet channel provides an opening connected to the at least one opening proximate to the first fin and the outlet channel provides an opening connected to the at least one opening proximate to the first fin.

Example 15 includes any example, wherein when liquid is provided into the inlet channel: the inlet channel directs the liquid across the first fin using the at least one opening and after the liquid flows across the first fin, the liquid flows through the outlet channel away from the surface.

Example 16 includes any example, wherein the inlet channel, multiple fins, and the outlet channel are formed by skiving, machining or three-dimensional printing.

Example 17 includes any example, wherein the multiple fins comprise one or more of: copper and graphite.

Example 18 includes any example, wherein the surface comprises one or more of: copper, steel, or aluminum.

Example 19 includes any example, and includes a method comprising: directing fluid into a cold plate comprising a surface with attached fins and at least two channels, wherein a first opening directs the fluid towards the bottom surface, a second opening directs the fluid across a first fin, and a third opening directs the fluid away from the surface to reduce a temperature gradient of two or more circuit devices positioned under the surface.

Example 20 includes any example, wherein the second opening comprises split openings around the attached fins to separate unheated liquid from heated liquid.

Example 21 includes any example, comprising receiving liquid from opposing ends of different fins and directing the received liquid away from the different fins.

What is claimed is:

1. An apparatus comprising:
a first surface;
a second surface, the first surface to face towards the second surface, the second surface to face towards the first surface;
fins extending from the first surface towards the second surface, the fins including a first fin and a second fin spaced apart from the first fin; and
walls extending from the second surface towards the first surface, the walls including a first wall and a second wall defining and extending continuously along opposite sides of a first channel that extends between the first and second surfaces, the first wall defining a second channel extending along the first channel, the first wall separating the first channel from the second channel, the first and second fins to be within the first channel between the first and second walls, the first channel including a first opening in the second surface, the first opening between the first fin and the second fin, the first opening, the first fin, and the second fin along a length of the first channel, the first channel including a second opening in the second surface, the first fin being closer to the second fin than the second opening is to the second fin.

2. The apparatus of claim 1, wherein the first opening is structured to direct a fluid towards the first surface and the second opening directs is structured to direct the fluid away from the first surface.

3. The apparatus of claim 1, wherein the first channel includes a third opening in the second surface, the second fin being closer to the first fin than the third opening is to the first fin.

4. The apparatus of claim 3, further including a manifold to direct fluid towards and away from the first channel, the fluid to enter the first channel via the second and third openings and to leave the first channel via the first opening.

5. The apparatus of claim 3, further including a manifold to direct fluid towards and away from the first channel, the fluid to enter the first channel via the first opening and to leave the first channel via both the second and third openings.

6. The apparatus of claim 1, further including an inlet guide connected to the first opening and an outlet guide connected to the second opening.

7. The apparatus of claim 6, wherein the inlet guide is structured to receive fluid and direct the fluid to the first opening and towards the first fin.

8. The apparatus of claim 6, wherein the outlet guide is structured to receive fluid that traverses the first fin and direct the received fluid away from the first surface.

9. The apparatus of claim 1, further including a first fluid passageway structured to guide fluid towards the first channel and a second fluid passageway structured to guide the fluid away from the first channel, a temperature of the fluid guided towards the first channel less than a temperature of the fluid guided away from the first channel.

10. The apparatus of claim 1, wherein the fins are non-parallel with respect to the first surface.

11. The apparatus of claim 1, further including a circuit board including one or more devices, the circuit board in proximity to the first surface, the one or more devices including one or more of: a central processing unit (CPU), a graphics processing unit (GPU), a digital signal processor (DSP), an application specific integrated circuit (ASIC), a programmable logic device (PLD), or an accelerator.

12. The apparatus of claim 1, wherein the first fin has a first width and a first length, and the first channel has a second width and a second length, the first length greater than the first width, the second length greater than the second width, the first length of the first fin aligned with and extending along the second length of the first channel.

13. The apparatus of claim 12, wherein the second length is multiple times greater than the first length, a plurality of the fins being end-to-end along the second length of the first channel.

14. The apparatus of claim 1, wherein the fins include third and fourth fins to be within the second channel.

15. The apparatus of claim 1, wherein the fins include a plurality of fins that are along a length of the first channel, the plurality of fins including the first and second fins, the first channel including a plurality of openings, the plurality of openings including the first and second openings, and different ones of the plurality of openings being between adjacent ones of the fins along a longitudinal length of the first channel.

16. The apparatus of claim 15, wherein the plurality of openings and the fins are in an alternating pattern along the longitudinal length of the first channel.

17. The apparatus of claim 15, wherein successive ones of the plurality of openings along the longitudinal length of the first channel alternate between inlets and outlets for fluid to respectively enter and leave the first channel.

18. A method comprising:
directing fluid into a cold plate, the cold plate including:
a first surface;
a second surface, the first surface to face towards the second surface, the second surface to face towards the first surface;
fins extending from the first surface towards the second surface, the fins including a first fin and a second fin spaced apart from the first fin; and
walls extending from the second surface towards the first surface, the walls including a first wall and a second wall defining and extending continuously along opposite sides of a first channel that extends between the first and second surfaces, the first wall defining a second channel extending along the first channel, the first wall separating the first channel from the second channel, the first and second fins to be within the first channel between the first and second walls, the first channel including a first opening in the first surface, the first opening between the first fin and the second fin, the first opening, the first fin, and the second fin along a length of the first channel, the first channel including a second opening in the second surface, the first fin being closer to the second fin than the second opening is to the second fin; and directing the fluid away from the cold plate.

19. The method of claim 18, wherein the first channel includes a third opening in the second surface, the second fin being closer to the first fin than the third opening is to the first fin.

20. The method of claim 18, further including directing the fluid towards opposing ends of different ones of the fins and directing the fluid away from the different ones of the fins after the fluid traverses across the fins.

* * * * *